(12) United States Patent
Lawson et al.

(10) Patent No.: US 8,479,138 B1
(45) Date of Patent: Jul. 2, 2013

(54) GLOBAL CONSTRAINT OPTIMIZATION

(75) Inventors: Randall Scott Lawson, Westford, MA (US); Richard Allen Woodward, Jr., San Diego, CA (US); Brett Allen Neal, Monument, CO (US); Ken Wadland, Grafton, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 406 days.

(21) Appl. No.: 12/567,690

(22) Filed: Sep. 25, 2009

(51) Int. Cl.
*G06F 17/50* (2006.01)

(52) U.S. Cl.
USPC ............ 716/126; 716/108; 716/110; 716/113; 716/132; 716/134

(58) Field of Classification Search
USPC .................. 716/106–113, 126, 132, 134, 136
See application file for complete search history.

(56) References Cited

U.S. PATENT DOCUMENTS

| | | | |
|---|---|---|---|
| 7,464,358 B1 | 12/2008 | Wadland et al. | |
| 7,536,665 B1 | 5/2009 | Horlick et al. | |
| 7,562,330 B1 | 7/2009 | Wadland et al. | |
| 7,761,836 B1 | 7/2010 | Wadland et al. | |
| 2007/0028201 A1* | 2/2007 | Mehrotra et al. | 716/12 |
| 2007/0106969 A1* | 5/2007 | Birch et al. | 716/6 |
| 2009/0031275 A1* | 1/2009 | Cho et al. | 716/13 |
| 2011/0055791 A1* | 3/2011 | Gao | 716/131 |

OTHER PUBLICATIONS

Demir, Alper, et al., "A Reliable and Efficient Procedure for Oscillator PPV Computation, With Phase Noise Macromodeling Applications," IEEE Transactions on Computer-Aided Design of Integrated Circuits and Systems, Feb. 2003, pp. 188-197, vol. 22 No. 2.
Demir, Alper, et al., "Phase Noise in Oscillator: A Unifying Theory and Numerical Methods for Characterization," IEEE Transactions on Circuits and Systems-I: Fundamental Theory and Applications. May 2000, pp. 655-674, vol. 47 No. 5.
Mei, Ting, et al., "Oscillator-AC: Restoring Rigour to Linearized Small-Signal Analysis of Oscillators," Computer-Aided Design, 2005,. ICCAD-2005. IEEE/ACM International Conference on Nov. 6-10, 2005, Dec. 19, 2005, pp. 603-608.
Wadland, Ken, et al., "Method and Mechanism for Implementing PCB Routing," U.S. Appl. No. 11/098,039, filing date unknown.

* cited by examiner

*Primary Examiner* — Paul Dinh
(74) *Attorney, Agent, or Firm* — Holland & Knight LLP; Mark H. Whittenberger, Esq.

(57) ABSTRACT

Techniques that can improve the efficiency of routing where connections are subject to elongation constraints. The design can be optimized by estimating elongation needed to meet constraints after an initial routing solution has been generated, but before elongation is actually applied to detailed paths. Paths can be re-routed at this earlier stage if it is determined that too much elongation, or too much elongation in crowded areas, will need to be added after the detail routing stage.

37 Claims, 9 Drawing Sheets

GLOBAL CONSTRAINT OPTIMIZATION

BACKGROUND OF THE INVENTION

This application relates generally to integrated circuit ("IC") and printed circuit board ("PCB") design, and more particularly to automated or semi-automated methods of determining interconnections or paths between components or subcomponents that need to communicate with each other. The description will be in terms of PCB design, but embodiments of the present invention can be used for IC package design, and possibly for IC routing or redistribution layer (RDL) routing.

Finding a geometric solution for a design is commonly referred to as "routing" the design. If the routing is done automatically, the process is called "autorouting" and the mechanism or algorithm doing the autorouting is called an "autorouter." When this process is done interactively by a human operator, often called a "PCB designer," the process is called "manual routing."

The basic job of any autorouter is to connect "pads" according to a user-specified "netlist" and user-specified "constraints." The term "pad" refers to a location on a design to which printed wires can be connected (depending on the vendor and the underlying technology, pads might have many different names, such as terminals, pins, bumps, balls, or I/O pads). The "netlist" describes which pads must be connected together by "wires" and (optionally) in what order they must be connected. The term "connection" will be used to mean a set of one or more source pads and a set of one or more target pads for which one or more connecting paths are to be found. The path(s) are ultimately implemented as one or more signal traces on a PCB or semiconductor package, for example.

The term "constraint" refers to a rule that must be met by the paths implementing the netlist connections. Some constraints are physical, such as "Keep the paths of net A at least 5 mil away from the paths of net B." Some constraints are electrical, such as "The propagation delay between pads P1 and P2 must be less than x nanoseconds." Still other constraints are defined in terms of match or relative units. For example, "Path A and path B must have the same propagation delay (to within a tolerance of ±x nanoseconds)" or "The total paths length between pads P1 and P2 must be at least x % longer than the paths length between pads P2 and P3." At least some constraints can be addressed by applying "elongation" to routed paths. The term "elongation" refers to changing the length(s) or delay(s) of the path(s) of one or more connections that are subject to the constraint.

Autorouting is known to be "intractable" (also called EXP-TIME-Complete). In other words, it is one of a class of computationally hard problems for which there is no polynomial-time bounded solution. In simpler terms, the term "intractable" refers to the fact that finding the absolute best solution for a "reasonably" large data set is not possible in a "reasonable" amount of time. Although it is theoretically possible to consider every possible geometric solution and then select the best solution, doing so might take hundreds of years. Thus, the autorouting problem has always been about finding a "reasonable" solution in a "reasonable" amount of time.

Most (if not all) modern commercial autorouters use a routing engine algorithm called a Single Connection Router ("SCR") to find one path for one connection, where a connection consists of two sets of pads from the same signal that need to be connected to meet the design requirements. The first set of pads is generally referred to as the "source"; the other set is referred to as the "target." Note that it is very common that each set has only one pad. In this case, the autorouter must connect one source pad to one target pad. The SCR is used repeatedly to connect one set of source pads to one set of target pads until all connections have paths and the design meets all design constraints, including electrical constraints (such as match).

An increasing percentage of modern designs are both geometrically dense and have many electrical constraints. For such designs, there may not enough real estate remaining for the autorouter or for a manual designer to add the necessary elongation to meet all of the constraints.

SUMMARY OF THE INVENTION

Embodiments of the present invention provide techniques that can improve the efficiency of routing where connections are subject to elongation constraints. Aspects of the invention include methods, apparatus, and computer program products using these techniques, as well as articles of manufacture (e.g., PCBs, IC packages, and possibly ICs) based on designs resulting from using such methods, apparatus, and computer program products.

Routing methods and systems according to embodiments of the present invention operate on a set of connections subject to a set of constraints including a set of elongation constraints. In this context, the term "connection" is used to refer to a set of one or more source pads and a set of one or more target pads for which a set of one or more connecting paths is to be found. During the routing process, a given connection's path(s) may be modified one or more times. In this context, the term "elongation constraint" is used to refer to a constraint that can be addressed by changing the length(s) or delay(s) of the path(s) of one or more connections subject to the constraint. This is normally referred to as elongation, although in some instances the path length may need to be reduced.

Some embodiments use a "cost" to select paths. The cost refers a formula or the like which considers many different aspects of a path. The SCR analyzes the costs associated with various path options to select the path with the lowest cost.

In an aspect of the invention, a method includes generating an initial set of paths without considering at least some of the elongation constraints; estimating elongations that would, if they were applied to at least some paths in the initial set, cause the initial set of paths to meet the elongation constraints; and re-routing at least some paths in the initial set to generate a new (optimized) set of paths having a lower overall estimated elongation than that of the initial set of paths. The method determines and applies elongation based on the new set of paths to meet the elongation constraints.

Elongation is normally applied to geometric paths. Depending on the nature of the initial routing, detailed routing to provide geometric paths can occur at different stages. If the initial set of paths are topological paths, and if the new set of paths are topological paths as well, the method further includes generating corresponding geometric paths, and then determining and applying elongation to these geometric paths. If the initial set of paths are already geometric paths, the new set of paths can be geometric paths as well, in which case the method would determine and apply elongation to these geometric paths without additional generation of geometric paths.

In another aspect of the invention, a method includes generating an initial set of paths without considering at least some of the elongation constraints; estimating elongations that would, when applied to at least some paths in the initial set, cause the initial set of paths to meet the elongation constraints; using the estimated elongations to select connections for further processing; using information regarding at least some of the selected connections to generate a new set of paths that includes new paths replacing at least some paths in the initial set of paths, wherein the new set of paths requires less elongation to meet the elongation constraints than the elongation required by the initial set of paths; and elongating at least some of the paths in the new set of paths. The comments above regarding topological and geometric paths are generally applicable here.

In another aspect of the invention, a method includes generating an initial set of paths without considering at least some of the elongation constraints; estimating elongations that would, when applied to at least some paths in the initial set, cause the initial set of paths to meet the elongation constraints; selecting a set of elongation goals, at least in part based on the estimated elongations; optimizing the elongation goals by generating a new set of paths that includes new paths replacing at least some paths in the initial set of paths; and determining and applying elongation to at least some of the paths in the new set of paths to cause the new set of paths to meet the elongation constraints.

In embodiments of these methods, selecting connections for further processing (elongation goals) can include finding the next connection causing the largest expected elongation, or finding the next connection causing the largest total expected elongation, or finding the next constraint causing the largest sum of expected elongation.

In embodiments of these methods, generating new paths can include one or more of the following:
- un-routing the paths for a set of connections associated with a given elongation constraint, and determining paths for the set of connections in a different order than the order that was used in determining the initial set of paths;
- un-routing the paths for a set of connections associated with a given elongation constraint, determining a path for a given connection in the set with a reduced cost associated with that connection's path crossing another connection's path, and determining new paths crossed by the given connection's paths to eliminate the crossing;
- un-routing the paths for a set of connections associated with a given elongation constraint, determining a new path for a given connection in the set with a cost associated with that connection's path crossing another connection's path wherein the cost varies inversely with the expected elongation of the path being crossed, and determining new paths crossed by the given connection's path to eliminate the crossing;
- establishing a region of increased cost interposed in a direct path, and using a routing algorithm that causes a path in the new set to meander around the region of increased cost;
- establishing a set of waypoints displaced from a direct path, and using a routing algorithm that causes a path in the new set to meander so that it passes through at least one of the set of waypoints;
- using a router that subjects an existing path to a topological jump operation.

In other aspects of the invention, routing apparatus can include a computer system programmed to carry out any of the above routing methods.

In other aspects of the invention, a computer program product can include a computer-readable medium containing program instructions, which when executed by a computer system cause the computer system to execute any of the above routing methods.

A further understanding of the nature and advantages of the present invention may be realized by reference to the remaining portions of the specification and the drawings.

BRIEF DESCRIPTION OF THE DRAWINGS

FIG. 12 is a flowchart of a first implementation of FIG. 1's optimizing step—this implementation operates by ripping up (un-routing) all of the paths affected by a particular constraint and then re-routing them in a different order;

FIG. 13 is a flowchart of a second implementation of FIG. 1's optimizing step—this implementation operates by using a reduced crossing cost and then attempting to eliminate any resulting crossings by re-routing the other paths;

FIG. 14 is a flowchart of a third implementation of FIG. 1's optimizing step—this implementation operates by modifying the crossing cost such that it is inversely proportional to the expected elongation;

FIGS. 15 and 16 illustrate a fourth implementation of FIG. 1's optimizing step—this implementation operates by encouraging meandering through the use of a bounding box;

FIG. 15 shows an example of a meandering path;

FIG. 16 shows a bounding box defining a region of increased cost for traversal;

FIGS. 17, 18, 19, and 20 illustrate a fifth implementation of FIG. 1's optimizing step this implementation operates by encouraging meandering through the use of waypoints;

FIG. 17 shows an example of three connections between two pin grid arrays (PGAs);

FIG. 18 shows a reasonable topological solution for routing these connections;

FIG. 19 shows four waypoints (indicated by small hatched circles) through which the paths are required to pass;

FIG. 20 shows elongated meandering paths passing through three of the waypoints;

FIGS. 21 and 22 illustrate a sixth implementation of FIG. 1's optimizing step—this implementation operates by encouraging meandering through the use of topological jump operations;

FIG. 21 shows the topological solution resulting from a first topological jump operation being performed on the topological solution of FIG. 18;

FIG. 22 shows the topological solution resulting from a second topological jump operation being performed on the topological solution of FIG. 21;

DESCRIPTION OF SPECIFIC EMBODIMENTS

Router and Design Classification Terminology

Figure 1:
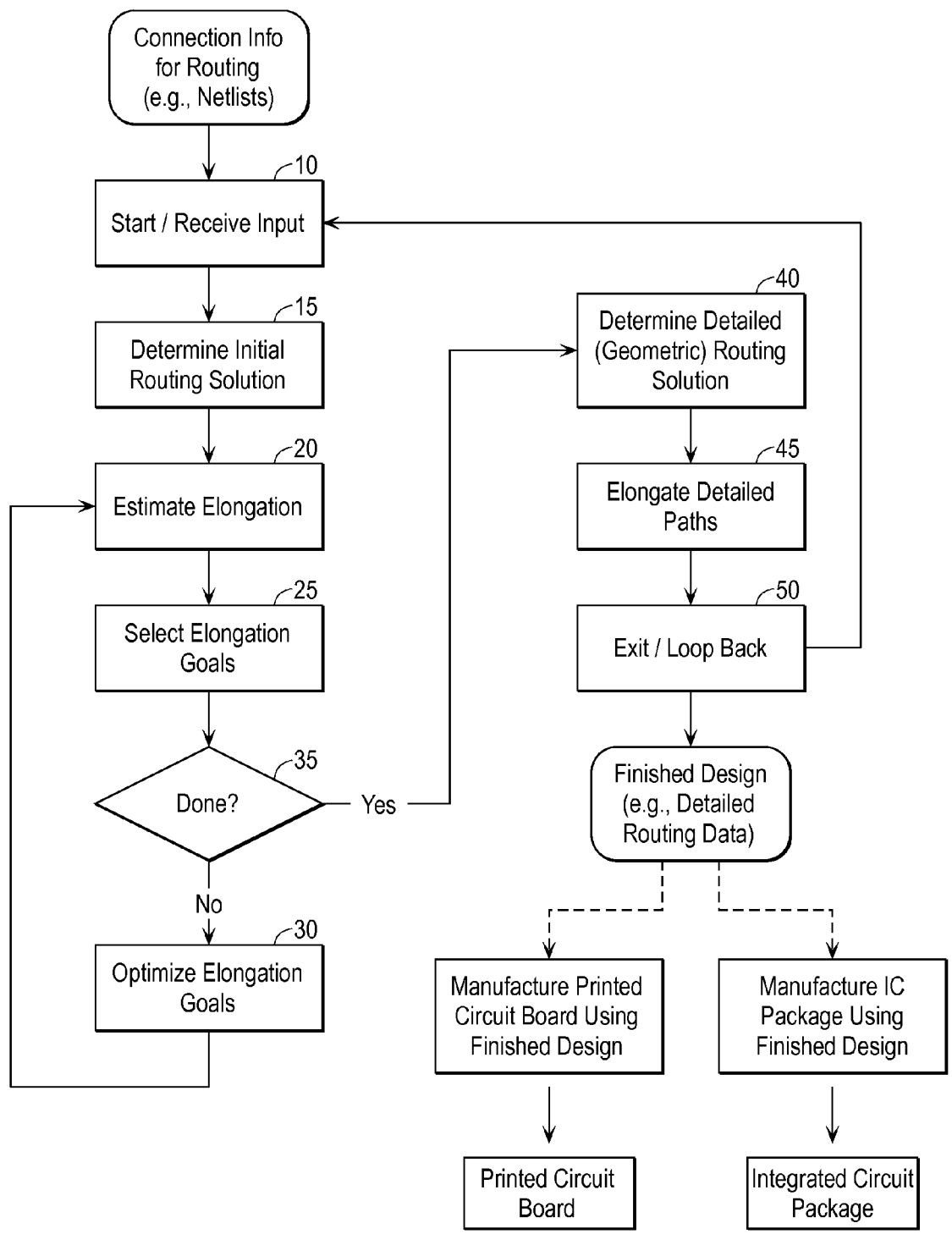
FIG. 1 is a flowchart of a routing method according to an embodiment of the present invention.

This section provides terminology in the context of the history of router development design categorization. However, the discussion also reflects a recognition of problems with existing designs, some or all of which problems may not have been previously recognized.

The earliest autorouters are referred to as "greedy" routers. They selected one connection (often one pair of pads from one signal) and used an SCR to find a path for it. They then selected another connection and found a path that did not conflict with the path assigned to the previous connection. The algorithm iterated until all connections had a path. The easiest designs, sometimes referred to as "Type I" designs, have plenty of space available for routing ("real estate") and few constraints. For these easy designs, greedy routing algorithms work reasonably well. They did fail to find a path for some connections but these could often be manually completed by a PCB designer.

For dense designs, sometimes referred to as "Type II" designs, greedy routing algorithms failed too many connections to be useful. There simply is not enough real estate for them to find all the paths, and after they used up too much real estate, there wasn't enough real estate left for a PCB designer to manually complete the design.

What are referred to as "rip-up" routers were developed to address this problem. Therefore, most (if not all) modern commercial routers enhance their SCR by allowing it to select paths which cross other paths. In a rip-up router, violations are sometimes temporarily allowed, and the SCR is run again to find a new path for the offending path.

Most (if not all) modern SCR algorithms use a "cost" to select paths. The cost refers a formula which considers many different aspects of a path. The SCR uses some algorithm, such as a costed-wavefront, to select the path with the lowest cost. In this case, a cost can be assigned to causing a crossing violation (sometimes called a "conflict"). A rip-up router typically adjusts the various routing costs, such as gradually increasing the "crossing cost," until there are no crosses remaining Rip-up routers have had excellent success finding solutions that meet geometric constraints, such as minimum space between paths.

For designs with many electrical constraints, sometimes called "Type III" designs, rip-up routers often fail to be able to meet all constraints. There are simply too many interacting constraints for a simple rip-up autorouter to meet all of the constraints. To meet this challenge, autorouters were developed that assigned costs to violations of electric constraints. The SCR still sought a solution with the lowest total cost but now the costs computations had more input parameters. These additional inputs could be in several different units, such as length, time, voltage, etc.

Different weights are typically assigned to different cost inputs in an effort to find a solution that balances multiple requirements and produces a valid solution (either topologically or geometrically). Unfortunately, this weighting process is extremely difficult. Different designs require different weights at different times during the autorouting process in order to achieve a reasonable solution in a reasonable amount of time.

Rather than solving the entire problem through the SCR, most autorouters break the problem into two stages. During routing, the autorouter seeks to find a solution that meets geometric constraints and "maximum" electrical constraints. After routing is completed, a post processing stage is applied that adds elongation where needed to meet the "minimum" and "match" electrical constraints. When this works, it is a reasonable compromise. However, an increasing percentage of modern designs are both geometrically dense and have many electrical constraints. Such designs are sometimes called "Type IV" designs. For these Type IV designs, there is not enough real estate remaining for the autorouter or for a manual designer to add the necessary elongation to meet all of the constraints.

Overall Process Flow and Examples

As will be described below, embodiments of the present invention operate to optimize the design by estimating elongation needed to meet constraints after an initial routing solution has been generated, but before elongation is actually applied to detailed paths. Paths can be re-routed at this earlier stage if it is determined that too much elongation, or too much elongation in crowded areas, will need to be added after the detail routing stage.

Subheadings are used in this application solely for convenience, and should not be taken to limit anything in the description.

Overall Process Flow

FIG. 1 is a flowchart of a routing method according to an embodiment of the present invention. Embodiments of the present invention will be described in terms of routing connections on a printed circuit board ("PCB") and for simplicity of explanation, examples used to illustrate various point show single-layer routing. In multi-layer designs, paths are usually allowed to cross each other on different layers but not on the same layer. Although the figures show single-layer designs, embodiments of the present invention described here can also be applied to multi-layer designs.

The method shown in FIG. 1 can be performed by a general purpose computer system executing instructions, and will sometimes be described in terms of a system taking action or performing a step. The basic flow is as follows. At a step 10, the system receives input representing paths to be routed. This input can be a netlist or any other representation of the layout of the PCB pads. At a step 15, an initial routing solution is determined (thereby providing an initial set of paths) without considering the elongation constraints, or at least without considering some of the elongation constraints. The initial routing solution can, however, take into account other constraints, such as a prohibition on paths crossing on the same layer, and requirements that there are no "overloads" (channels between non-moveable objects without sufficient clearance to meet the manufacturing rules).

In a specific embodiment, step 15 (determining an initial routing solution) is implemented using a constraint-aware topological autorouter. In other words, this step is implemented by an autorouter that has an SCR algorithm that uses constraint information to find a topological solution. However, the initial routing solution can be created by other routing processes, including manual routing or traditional geometric autorouting. It is preferred, however, that the initial solution meets all constraints other than elongation requirements, whatever mechanism is used to determine the initial routing solution.

Overview of Estimating Elongation

At a step 20, the system estimates an elongation for each of the connections. This can be for the entire set of connections (i.e., for the entire design), or for only part of the design. Embodiments of the present invention seek to minimize the total final path length (after elongation; hence the step of determining how much elongation will be needed. In this discussion, some of the issues and processing decisions are introduced. A more detailed discussion will be provided later.

To estimate elongation, each constraint can be considered separately, and a number of questions can be posed and addressed. The computation is generally dependent upon the type of constraint imposed. For example, do all related paths currently meet that constraint? If not, what could be done to meet that constraint? For example, a "match" constraint might require that all paths have the same propagation delay plus or minus a tolerance. Could the constraint be met if elongation were added to some of the paths in the match group? Would less elongation be needed if some of the paths were made shorter?

Similar computations could be done for a "relative" constraint, where some paths must have a length or propagation delay relative to some other reference paths (plus or minus a tolerance). Could the constraint be met by adding length to one or more of the relative paths or to the reference path? If the reference path were made shorter, would less elongation be needed? If the relative paths were made shorter, would less elongation be needed? A simpler example is a "minimum" constraint, where a path must have a minimum length (or propagation delay). For the example of a minimum constraint, if the current value of the path length is less than the specified minimum value, the only way to meet the constraint is to add length.

The above computations are preferably performed for every constraint that might require elongation. In some cases, these computations are repeated since some constraints overlap. For example, suppose there are three buses B1, B2, and B3, where each of these buses has several paths in them. Suppose each of the buses has a match constraint. And, further suppose that there are relative constraints between paths in these various buses. Adding length to one of the paths to meet of these constraints could force additional elongation to be added to one or more paths to satisfy a different constraint, which could cascade to even more paths.

A test that a complete set of elongations has been found is that, if all of the estimated elongation were somehow added, then all of the constraints are met. It is possible that this test cannot be satisfied. The original routing problem might be over-constrained. That is, it might not be possible to find a complete set of estimated elongations. For example, suppose path X has a constraint that it must be shorter than 50 mil and path Y has a constraint that it must be at least 100 mil, and further assume a third constraint that paths X and Y must have the same length (±5 mil). In this case, it is impossible to compute an "estimated elongation" for both paths X and Y that meets all three constraints. If this happens, embodiments of the present invention can report the problem to the user. Depending on particular implementations, including user preferences and user input, the system can terminate or it can attempt to continue with a weaker set of constraints.

Overview of Selecting Goals

With a set of estimated elongations determined at step 20, the system, at a step 25, proceeds to select elongation goals with one or more paths selected as the goal. In some embodiments, the only goals to be selected are those where the goal is to reduce the length (or propagation delay) which in turn will reduce the expected elongation. There are several possible algorithms for selecting the goals to be optimized.

A simple algorithm is to iterate over each of the constraints. On each pass, one constraint is selected, and for that one selected constraint, the elongation goal for each of the paths associated with that constraint is selected. Another simple algorithm is to iterate by path. For example, on each pass one initial path can be selected, and then its elongation goal and the elongation goals for all paths that share a constraint with the initial path can be selected. If this algorithm is used, it can be desirable to avoid iterating over paths whose elongation goals have already been processed in an earlier iteration due to selection of some other signal.

In some embodiments of the present invention, this process can be controlled by the user. For example, the user could specify "design intent" by indicating which constraints should be met first. In this case, the system could select the highest priority constraint first then work its way to down until all constraints have been optimized.

Overview of Optimizing Goals

At a step 30, the system optimizes the elongation goals. This entails, for at least some of the elongation goals, determining a new path for at least one connection associated with that elongation goal. Each of the elongation goals to be optimized indicates that a particular connection (part of a signal) should be longer or shorter than it currently is. Based on the list of elongation goals and the current routing state of the overall design, the system logically divides all connections into one of three groups: routable (connections that will be sent to the SCR for processing to (potentially) find new paths), shovable (connections that will not be sent to SCR but might be modified to make room for new paths for the routable connections), and frozen (connections that cannot be modified).

The routable connections will normally include all connections in the signals from the selected elongation goals. They can also include closely related signals, such as signals in the same "bundle" or "flow." A bundle is a set of two or more connections that are routed together. The shovable connections will normally include neighboring signals or signals that have been identified as being "intertwined" with the routable connections. The frozen connections can be used, for example, to prevent changes to areas of the design that have already been completed. Frozen connections limit the number of choices available to the SCR, and hence allow it to run faster. In some embodiments, the frozen list is empty, in which case all connections not in or directly related to the elongation goals would be shovable.

For each routable connection, the SCR is invoked. The cost settings can be normal cost settings except that the costs associated with too much (or too little) length can be higher. This will help the SCR to find paths that will optimize the need to elongate later. Although it may be possible to use these higher length related costs early in the process, in most cases, doing so will excessively slow down the routing process. A benefit for embodiments of the present invention is that the high costs are only enabled after the initial paths have been found and the elongation needed has been estimated.

Since optimizing the goals can entail finding a new paths, the system loops back to step 20 so that the elongation can be estimated for the new paths. The system now iterates over the routable connections, until (1) all of the elongation goals have been met, (2) no further progress is made, or (3) an arbitrary number of passes have been completed.

These conditions are shown schematically as a branch 35, which determines whether the system continues to optimize elongation goals at step 30, or branches out of the loop. If the system branches out, the subsequent processing includes, in at least some scenarios, a step 40 of determining a detailed (geometric) routing solution is performed. This can be implemented using the matching geometric engine that is normally used with the topological autorouter, if step 15 (determining an initial routing solution) is implemented using a topological autorouter.

FIG. 1 shows step 40 as being performed after the elongation goal optimization has completed. This will be the case where the initial routing solution determined at step 15 was a topographical solution. If, on the other hand, the initial routing solution was a geometric solution, the system does not implement step 40 here (since it would have been implemented as part of step 15, namely as part of the initial routing solution). A geometrical initial routing solution can be provided, for example, by manual routing or using a traditional geometric autorouter. There is a possible scenario where the initial paths are geometric paths, but where any such paths that are to be rerouted are converted to topological paths for rerouting by a topological router. In such a scenario, the rerouted topological paths would be converted back to geometric paths before adding elongation.

Regardless of whether step 40 (determining a detailed routing solution) is implemented at this point or earlier, at a step 45, the requisite detailed paths are elongated by the requisite amounts. Step 45 (elongating detailed paths) can use any known mechanism to add length where required. Elongation can be added using one or more of many different patterns, including, for example, sawtooth, accordion, and trombone. Elongation can be added with or without mitering. The system might simply report where elongation is needed and allow the user to add the elongation manually.

In a specific embodiment, a mechanism is provided allowing the user to specify the preferred and/or acceptable elongation patterns to use and define the parameters by which the patterns are added. The system can then automatically add elongation wherever possible and report any failures to the user. Alternatively, or in addition, elongation can be implemented using "meander." That is, the autorouter used in step 15 could be rerun to find a longer path. Typically, autorouters attempt to find the shortest path implementing their signal path. However, by manipulating the control parameters to the routing engine (e.g., SCR), is it sometimes possible to find an equally acceptable signal path that takes a less optimal route to the target. In this way, less elongation (or perhaps, no elongation) will be needed.

After elongating the paths, the system exits at a step 50. In the event that the input provided at step 10 covered only a portion of the design, the system can loop back to step 10 to retrieve additional input and process the additional portions of the design. The output of the method is finished design data in the sense that this stage of the design is finished. The data can be subjected to further design steps. At some point the finished design is used in the layout and manufacture of PCBs or IC packages, for example. This is shown schematically as additional blocks in the figure, with the ultimate output of PCBs or IC packages.

FIG. 1 is simplified in a number of respects for explanatory purposes, and various loops and feedback are not shown. Some embodiments of the present invention can include feedback between various steps; for example steps 40 and 45 can provide feedback to earlier steps if problems are uncovered. Additionally, as alluded to above, there is no requirement that the entire design be processed at one time, and various iterative sequences beyond the ones explicitly mentioned can be implemented to allow partial processing of the design. Furthermore, different portions of the design can be processed in parallel, in different threads on the same workstation or on different workstations.

As an order of magnitude, while the entire design may have thousands of connections, some implementations operate on a smaller number of connections (e.g., no more than 256). Thus, some embodiments can reduce complexity by selecting a subset of the entire problem, namely a subset of the elongation goals (step 25), and optimizing the subset of elongation goals (step 30), then taking another subset of and optimizing it until all constraints can be met (or until the algorithm is terminated).

Another consideration is that for certain designs (e.g., Type IV designs), a single pass for a given portion of the design may not be sufficient. During detail routing (step 40), the path lengths might change significantly from their estimated values. In this case, rerunning steps 20 (estimate elongation), 25 (select elongation goals), and 30 (optimize elongation goals) might produce a better result. During elongation (step 45), path lengths might also change significantly. For example, in order to elongate a particular path, it might be necessary to shove another path out of the way, increasing its length. This might cascade back to the original connection or yet another connection. Therefore, it might be necessary to rerun steps 20, 25, and 30, and go back to step 40 (determine detailed routing solution) or, perhaps, all the way back to step 15 (determine initial routing solution).

EXAMPLES

Additional details of the above steps will be described below, but at this point it is helpful to discuss some examples in order to demonstrate how embodiments of the present invention operate to optimize overall elongation.

Figure 2:
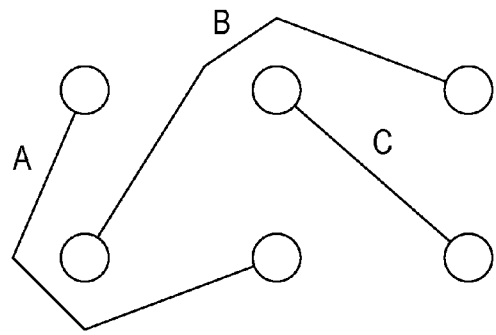
FIG. 2 is a schematic view showing a tiny section of a design with three paths (labeled A, B, and C) connecting six pads.

FIG. 2 is a schematic view showing a tiny section of a design with three connections with respective paths (labeled A, B, and C) connecting six pads. This shows one way to connect the pads. This is what is referred to as a topological solution, that is, none of the paths "cross" (occupy the same space on the same layer) and there are no "overloads" (channels between non-moveable objects without sufficient clearance to meet the manufacturing rules) but the signal paths do not yet have geometric details that meet the clearance requirements. For example, path A travels very close to the pad in the lower left corner but there is plenty of room available nearby.

Figure 3:
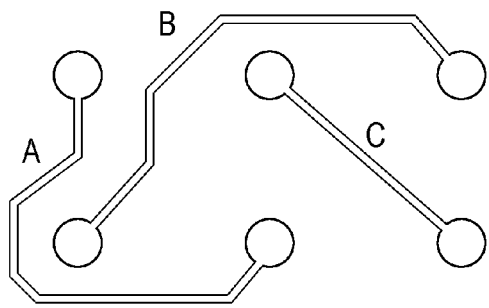
FIG. 3 is a schematic view showing the same design with geometric detailed paths that correspond to the topological paths from FIG. 2.

FIG. 3 is a schematic view showing the same design with geometric detailed paths that obey the topological paths from FIG. 2. Suppose there is a match constraint that requires paths A, B and C to be approximately the same length. In FIG. 3, path C is much shorter than either of the other two paths thus violating the match constraint.

Figure 4:
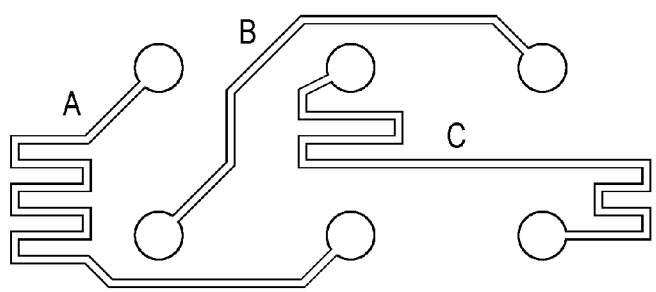
FIG. 4 is a schematic view showing one possible geometric solution with elongation of paths A and C.

FIG. 4 is a schematic view showing one possible way in which the paths could be adjusted to make the detailed segment path length of all three paths approximately the same. This has been done by adding additional segments to paths A and C, making them longer than is necessary to connect their pads. It can be appreciated that a solution such as that shown in FIG. 4 might be considered unusable, thus requiring expensive and time-consuming rework. Even if the solution is found to be usable, the amount of required elongation might still be considered undesirable.

The fact that paths A and C require so much elongation can, for example, be a result of the fact that path C was routed first, path B second, and path A third. Thus, path C is direct, path B needs to go around the upper pad connected to path C, and path A needs to go around the lower pad connected to path B. The result shown in FIG. 4 can be representative of a traditional flow (i.e., without using embodiments of the present invention) that included steps 10 (receiving input), 15 (determining an initial routing solution), 40 (determining a detailed routing solution), 45 (elongating detailed paths), and 50 (exiting/looping back).

The addition of steps 20 (estimating elongation), 25 (selecting elongation goals), and 30 (optimizing elongation goals) to the traditional flow mentioned above can prevent a design such as that shown in FIG. 4 having been pursued to completion before needing to be discarded. Consider a scenario where the connections had been processed in a different order in step 15.

Figure 5:
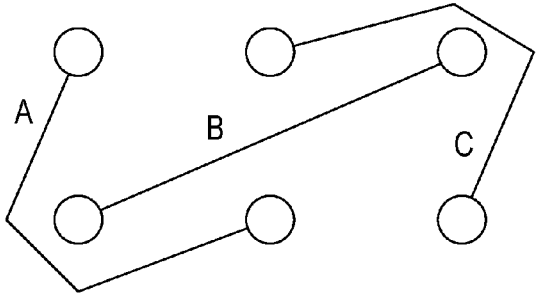
FIG. 5 is a schematic view showing an alternative topological solution to that of FIG. 2.
Figure 6:
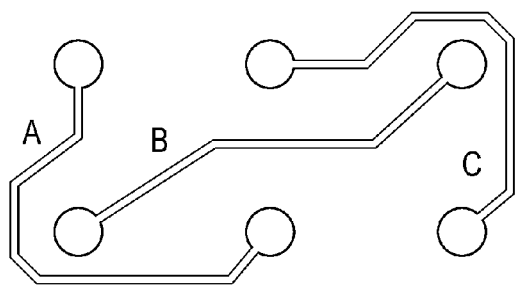
FIG. 6 is a schematic view showing one way in which the topological solution of FIG. 5 can be implemented geometrically.

FIG. 5 is a schematic view showing an alternative topological solution to that of FIG. 2. In this figure, the same pads are connected together as they were in FIG. 2, but the topological paths are different. This solution is one that might arise if connection B had been routed first, which would force the paths for connections A and C to go around connection B's pads. FIG. 6 is a schematic view showing one way in which the topological solution of FIG. 5 could be implemented geometrically.

Figure 7:
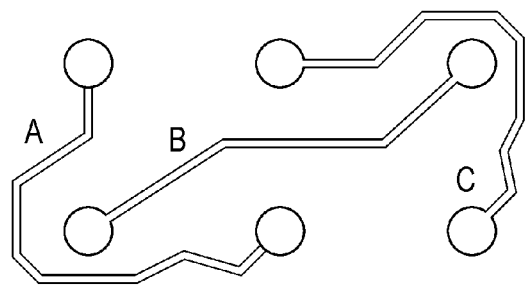
FIG. 7 is a schematic view showing one way how the geometric solution from FIG. 6 can be modified to meet the match constraint.

FIG. 7 is a schematic view showing one way how the geometric solution from FIG. 6 can be modified to meet the match constraint. It is clear that paths A and C require significantly less elongation in this solution than was required in the solution of FIGS. 2 through 4. However, prior to elongation, this fact would likely not have been discovered. First, the two topological solutions (FIGS. 2 and 5) are very similar and have approximately the same total signal length. Second, the two geometric solutions (FIGS. 3 and 6) have approximately the same total signal length. The fact that the final geometric solutions with elongation added (FIGS. 4 and 7) have very different total signal lengths.

Had the elongations been estimated for the topological solution of FIG. 2, using techniques according to embodiments of the present invention, an alternative topological solution could have been discovered sooner in the process. This is but one example of how embodiments of the present invention can find an optimized solution (such as the one in FIG. 5) before adding elongation. Put another way, embodiments of the present invention can transform an existing topological solution (like that shown in FIG. 2) into an alternative topological solution (like that shown in FIG. 5) where the total final signal length after elongation is optimized (reduced) before actually generating the geometric solution (FIGS. 3 and 6) and before generating the elongation (e.g., FIGS. 4 and 7).

The existence of a topological solution is not essential to embodiments of the present invention. In the case of a purely geometric router, embodiments can be used to convert one geometric solution (e.g., like FIG. 3) into an alternative geometric solution (e.g., like FIG. 6) before generating the elongation (e.g., like FIGS. 4 and 7).

Details of the Process Steps
Details of the Process Steps—Estimating Elongation (Step 20 of FIG. 1)

As discussed above, in step 20, elongation is estimated for those paths where one or more constraints required elongation. Constraints that might require elongation include what are referred to as "minimum-length" constraints, "minimum-delay" constraints, "match-length" constraints, and "relative-match" constraints. Note that delay is normally computed in units of time not distance. It is possible to process and store elongation requirements in both time and distance units. However, it is often simpler if one is converted to the other. For example, all delay units could be converted to time, if the physical characteristics of the finished PCB are known, such as the signal propagation delay. Conversely, all units could be converted to distance, if the appropriate signal propagation delays are known. The propagation delay is usually different on different layers, so this must be taken into account.

In the case of a minimum-length constraint, the existing length of each path is computed and tallied. If the total length is less than the required minimum length, then the difference between these two values is the amount of expected elongation needed. A minimum-delay constraint is handled similarly. The total delay for all paths (including pin delays) is computed. The difference between the required minimum delay and the current actual delay is the amount of expected elongation.

Match-Length Constraint

Table 1 shows a simple example of a match-length constraint dealing with two paths, designated X1 and X2. For a match-length constraint to be met, all paths in a collection of paths must have the same length (or same delay) plus or minus some tolerance. The collection of paths is called the "match group." To process a match constraint, the current length (or delay) for each member of the match group is computed and the resulting lengths compared. The path with the longest length (or delay) in the match group is called the "long pole." The path with the shortest length (or delay) is called the "short pole."

If the difference in length (or delay) between the short pole and the long pole is greater than the allowed tolerance, then elongation will be needed. For each path in the match group, the expected elongation is computed as the difference between its length (or delay) and the length (or delay) of the long pole (taking into account both the tolerance value of for selected path and the tolerance value for the long pole).

In some cases, there are specified "relative offsets" for the paths in the match group. For example, path X1 might have an offset of 20. meaning that the current length plus 20 must match the rest of the match group. In these cases, the offset for each path is subtracted (or added) before determining which path is the long pole and which is the short pole and before determining the expected elongation for each path.

TABLE 1

Simple Match-length Example

| Path | Length | Offset | Tolerance | Expected Elongation | Constraint |
|---|---|---|---|---|---|
| X1 | 85 (L) | 0 | ±5 | 0 | Match to |
| X2 | 70 (S) | 0 | ±5 | 85 − 70 − 5 = 10 | within ±5 |

In this example, path X1 has a current length of 85, path X2 has a current length of 70, and there is a match-length constraint with a tolerance of ±5. In this case, path X1 is the long pole (designated by "L") and path X2 is the short pole (designated by "S"). Path X1 will have an expected elongation of 0 (since it is the long pole). Path X2 will have an expected elongation of 85−70−5, which is 10. In other words, if 10 units are added to the length of path X2, then both members of the match group will meet the match constraint (within the allowed 5 units).

Relative Match-Length Constraint

Table 2 shows a simple example of a relative-match constraint dealing with three paths, designated X1, X2, and X3.

For a relative-match constraint to be met, the length (or delay) of each path in its match group must be within some tolerance of a specified path, called the "target path" (possibly with a relative offset). For these constraints, the expected elongation for the target path is computed first, and then the current length (or delay) of the target path is compared with each of the other paths in the match group, taking into consideration the tolerance and relative offsets of all paths.

If the length (or delay) of any path is beyond the tolerance of the target path, then elongation to the target path will be needed. The expected elongation for the target path is the maximum of any such computed elongation. The expected length (or delay) for the target path is the actual current length plus the expected elongation. Once the expected length (or delay) for the target path has been computed, the expected elongation for the remaining paths in the match group can be computed as the difference between their actual lengths (or delays) and the expected length (or delay) of the target path.

TABLE 2

Relative-Match Example

| Path | Length | Offset | Tolerance | Expected Elongation | Constraint |
|---|---|---|---|---|---|
| X1 (T) | 350 | N/A | N/A | 0 | Match target path X1 to each other path (X2 and X3) within that path's tolerance |
| X2 | 200 | 0 | ±5 | 350 − 200 − 5 = 145 | |
| X3 | 250 | 20 | ±10 | 350 − 250 − 20 − 10 =70 | |

In this example, path X1 has a current length of 350 and is the target. Path X2 has a current length of 200, a relative offset of 0, and a tolerance of ±5. Path X3 has a current length of 250, a relative offset of 20, and a tolerance of ±10. The expected elongation (EL) for a given path X relative to the target T is given by the following formula:

$$EL(X,T) = (T\text{'s length}) - (X\text{'s length}) - (X\text{'s offset}) - (X\text{'s tolerance})$$

The expected elongation for the target path X1 is 0, since paths X2 and X3 are shorter. The expected elongation for path X2 is 350−200−0 −5, which is 145. Similarly, the expected elongation for path X3 is 350−250−20−10, which is 70.

Table 3 shows a simple example of another relative-match constraint dealing with the same three paths, X1, X2, and X3, except that path X2 is specified as the target.

TABLE 3

Another Relative-Match Example

| Path | Length | Offset | Tolerance | Expected Elongation | Constraint |
|---|---|---|---|---|---|
| X1 | 350 | 0 | ±5 | 350 − 345 − 5 = 0 | Match target path X2 to each other path (X1 and X3) within that paths tolerance |
| X2 (T) | 200 | N/A | N/A | 350 − 200 − 5 = 145 | |
| X3 | 250 | 20 | ±10 | 345 − 250 − 20 − 10 = 65 | |

In the example of Table 3, the target path X2 is not the longest path, and so its expected elongation is computed first. Comparing path X1 to path X2 yields 350−200−5 which is 145. Comparing path X3 to path X2 yields 250+20−200−10, or 60. Since 145 is larger than 60, the expected elongation for path X2 is 145, and the expected length for path X2 is 200+145 which is 345.

Next, the expected elongations for paths X1 and X3 are computed using the expected length of path X2. The expected elongation for path X1 is 350−345−5, which is 0. The expected elongation for path X3 is 345−250−20−10, which is 65.

Overlapping Match-Length Constraints

Table 4 shows an example of overlapping match constraints with six paths, X1-X3 that include a first relative-match group with paths X1-X3, and a second relative-match group with paths X4-X6. On Type III and Type IV designs, there can be many constraints on the same paths. These constraints can overlap and affect each other. When this occurs, the computations should be repeated using the expected length instead of the actual length. This process is repeated iteratively or recursively until all overlapping constraint effects are consolidated.

TABLE 4

Overlapping Match Constraints

| | Relative-Match Groups 1 and 2 | | | Match Group 3 Encompassing Match Groups 1 and 2 | | |
|---|---|---|---|---|---|---|
| Path | Length | Offset | Tolerance | Path | Offset | Tolerance |
| X1 | 1571 | 0 | ±5 | X1 | 0 | ±50 |
| X2 (T) | 1971 | N/A | N/A | X2 (T) | N/A | N/A |
| X3 | 1571 | 0 | ±5 | X3 | 0 | ±50 |
| Match target X2 to each other signal (X1 and X3) within that signal's tolerance | | | | | | |
| X4 | 1171 | 0 | ±5 | X4 | 0 | ±50 |
| X5 (T) | 1571 | N/A | N/A | X5 | 0 | ±50 |
| X6 | 1171 | 0 | ±5 | X6 | 0 | ±50 |
| Match target path X5 to each other path (X4 and X6) within that path's tolerance of ±5 | | | | Match target X2 to each other path (X1 and X3 − X6) within that path's tolerance of ±50 | | |

As shown in Table 4, there are six paths, X1 through X6 with current lengths 1571, 1971, 1571, 1171, 1571, and 1171, respectively. Relative-match group 1 (MG1) has path X2 as its target and constrains paths X1 and X3 with a tolerance of ±5. Relative-match group 2 (MG2) has path X5 as its target and constrains paths X4 and X6 with a tolerance of ±5. Relative match group 3 (MG3) has path X2 as its target and constrains the other five paths with a tolerance of ±50. (In this example, none of the paths has a relative offset. In other words the relative offset is 0.)

When considered separately, MG1 would produce estimated elongations for paths X1-X3 of 395, 0, and 395, respectively (since 1971−1571−5=395). Similarly, MG2 would produce estimated elongations for paths X4-X6 of 395, 0, and 395, respectively. However, MG3 would produce estimated elongations for paths X1-X6 of 350, 0, 350, 750, 350, 750, since 1971−1571−50=350 and 1971−1171−50=750.

In this example, MG3 imposes an expected elongation on path X5 of 350, which means its expected length will be 1571+350 or 1921. The computations for the expected elongation for paths X4 and X6 for MG2 were based on the current actual length of path X5 (which is 1571). Therefore, the computation for MG2 must be repeated using the expected length of path X5, not its current actual length. The computation yields expected elongation of 1921−1171−5 or 795 for paths X5 and X6. Thus, the final expected elongation for paths X1-X6 is 350, 0, 350, 795, 350, and 795, respectively. The long pole is path X2. The short pole is path X4.

While the various constraints discussed are examples of electrical constraints whose paths might need elongation to be met, embodiments of the present invention can be applied to any constraint that might need to use elongation. Further, all values are approximate. In a topological routing solution the length (or delay) of a given path can only be estimated from a topological solution. The exact length (or delay) is not known until the geometric solution is found.

Details of the Process Steps—Selecting Elongation Goals (Step 25 of FIG. 1)

As discussed above, in step 25 of FIG. 1, one or more goal connections are selected for processing in step 30. There are many potential algorithms that can be used to select the goals, and a number of them will be discussed below.

Largest Expected Elongation

Figure 8:
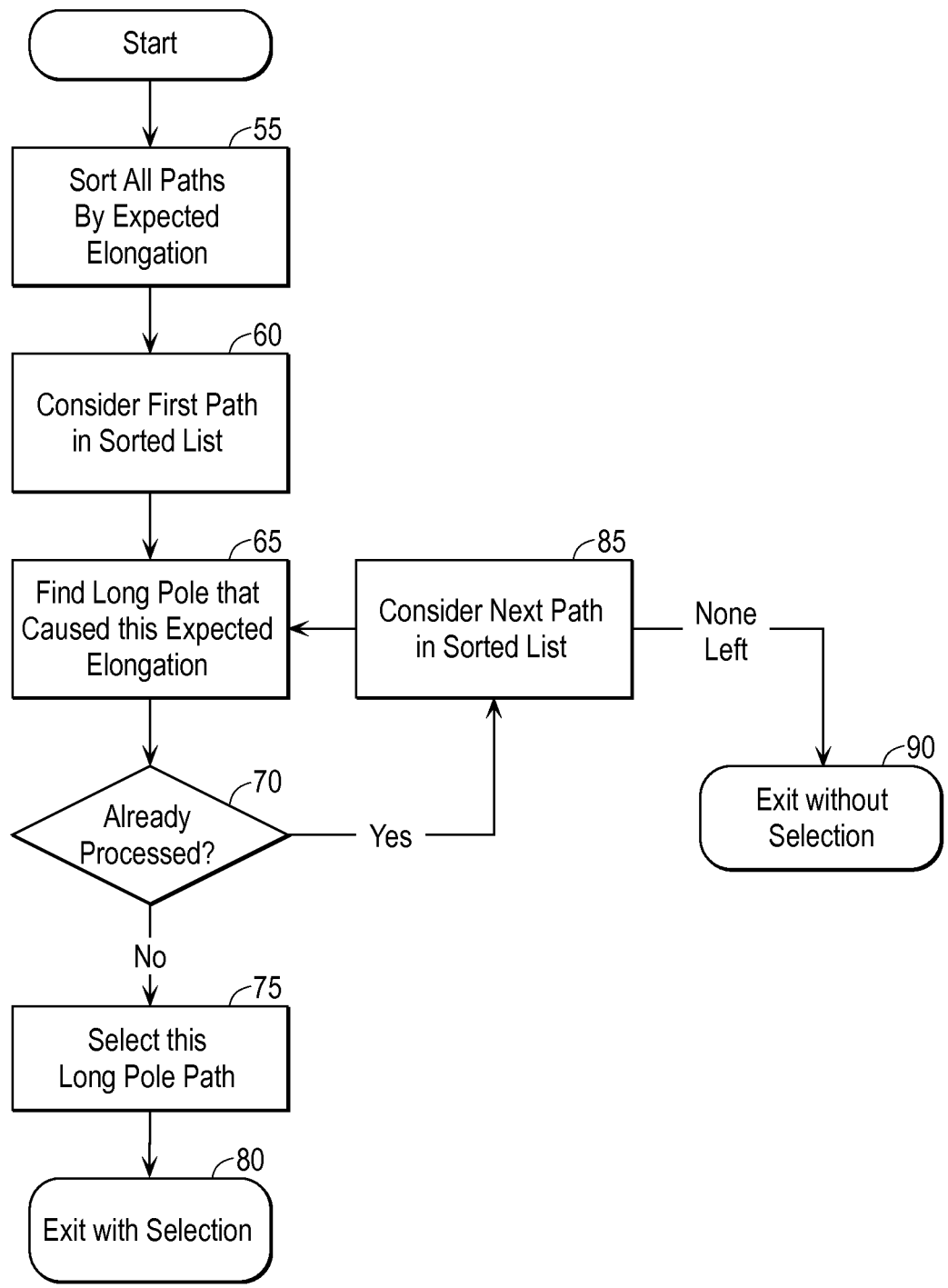
FIG. 8 is a flowchart of a first implementation of FIG. 1's goal-selecting step that operates by finding the next path causing the largest expected elongation.

FIG. 8 is a flowchart of a first implementation of FIG. 1's goal-selecting step 25. This implementation operates by finding the next path causing the largest expected elongation. At a step 55, the system sorts all paths by expected elongation, and at a step 60, the system considers the path with the largest expected elongation. Then, at a step 65, the system computes which path was the long pole when the expected elongation was computed. At a branch 70, the system tests whether this path had been previously selected as the goal and processed in a previous pass of step 30. If not, the system selects it at a step 75 and exits with that selection at a step 80. If this path had already been processed in step 30, then the system, at a step 85, moves on to the next largest expected elongation. However, if at step 85, it is determined that there are no more paths in the list to consider, the system exits with no selection at a step 90.

Consider how this algorithm would process the example shown in Table 3. At step 60, it would be determined that the largest expected elongation was 145 (for path X2). At step 65, it would be determined that the long pole causing this elongation was path X1. Therefore, it would be recognized that a reduction in length for path X1 would result in a reduction in expected elongation for path X2. As a side effect, it would also be recognized that a reduction in length for path X1 would result in a reduction in expected elongation for path X3.

Consider also how this algorithm would process the example shown in Table 4. The largest expected elongation was for 795 (for paths X4 and X6). The long pole which caused this elongation was path X2. It would then be recognized that any reduction in X2 will reduce the total expected elongation for X1 and X3-X6.

Largest Total Resulting Expected Elongation

Figure 9:
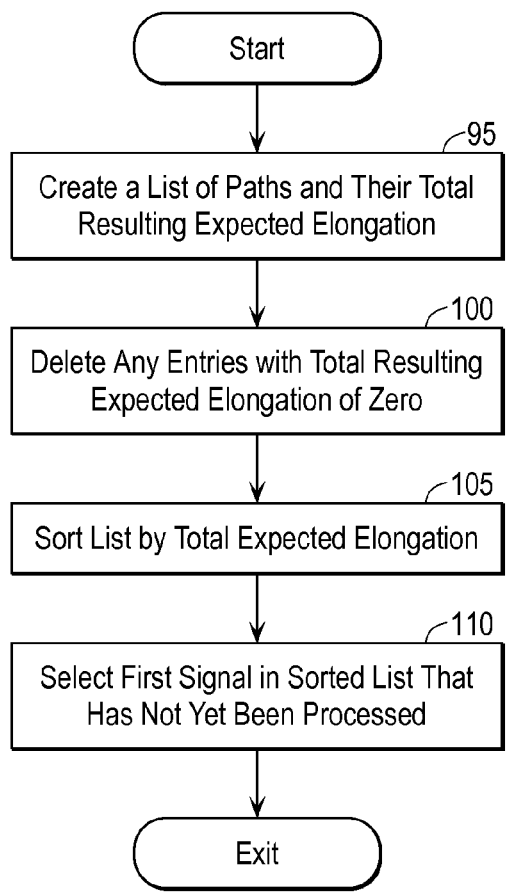
FIG. 9 is a flowchart of a second implementation of FIG. 1's goal-selecting step that operates by finding the next path causing the most total elongation.

FIG. 9 is a flowchart of a second implementation of FIG. 1's goal-selecting step 25. This implementation operates by finding the next path causing the most total elongation. At a step 95, the system computes the total resulting expected elongation for each path and stores this total in a table. The total resulting expected elongation is the sum of the expected elongation that is caused by this path being the long pole for one or more constraints. For the example shown in Table 2, path X1 causes resulting expected elongations of 145 (for path X2) and 70 (for path X3). Therefore, the total resulting expected elongation for path X1 is 145+70 or 215. Similarly, for the example shown in Table 4, the total resulting expected elongation for X2 is 350+350+795+350+795 or 2640.

At a step 100, after computing and storing the total resulting expected elongation for each path, the system deletes any entries whose total resulting expected elongation is zero. Then at a step 105, the system sorts this table by total resulting expected elongation. At a step 110, the system selects the first path in this sorted list that has not yet been processed in step 30 (of FIG. 1) and exits. If there are no entries remaining that have not yet been processed, then the system exits with no selection.

Largest Sum of Expected Elongation

Figure 10:
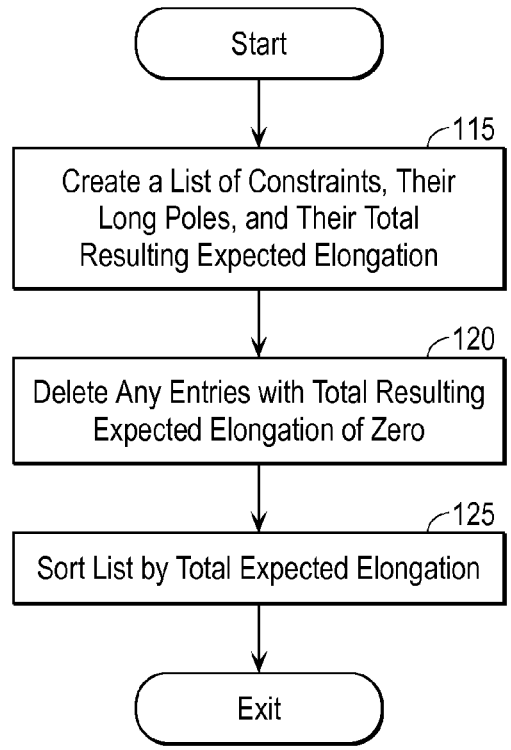
FIG. 10 is a flowchart of an initialization part of a third implementation of FIG. 1's goal-selecting step.
Figure 11:
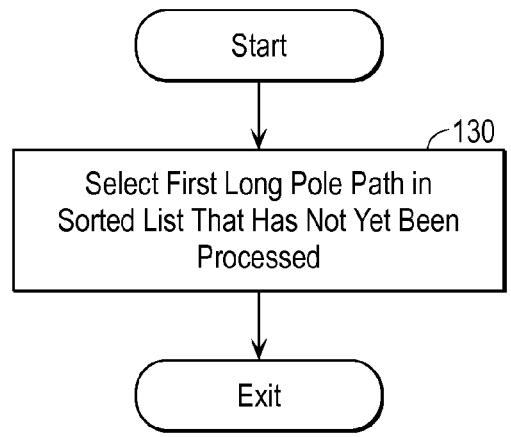
FIG. 11 is a flowchart of an iteration part of the third implementation of FIG. 1's goal-selecting step that operates by finding the next constraint causing the largest sum of expected elongation.

FIGS. 10 and 11 are flowcharts of a third implementation of FIG. 1's goal-selecting step 25. This implementation operates by finding the next constraint causing the largest sum of expected elongation. In this implementation, step 25 is split into two parts: initialization and iteration. Either of the other two implementations could have been split into two parts. Conversely, this implementation could be implemented together as was described in connection with the other two implementations.

FIG. 10 is a flowchart of the initialization part of the third implementation of FIG. 1's goal-selecting step. The initialization part is performed before entering the main loop, namely after step 15 (determining initial routing solution) and before step 20 (estimating elongation). At a step 115, the system creates a table with a row for each relevant constraint. Each row in the table has information about (i) the constraint, (ii) the path that was determined to be the long pole for this constraint, and (iii) the sum of the expected elongations caused by this constraint. For example, in the scenario shown in Table 3, the sum of the expected elongations for this constraint is 145+70 or 215.

At a step 120, the system deletes any entries in the table whose sum of expected elongation values is 0. At a step 125, the system sorts the table by the sum of expected elongation values. This information is kept in memory until the main loop of the main algorithm terminates.

FIG. 11 is a flowchart of the iteration part of the third implementation of FIG. 1's goal-selecting step. The iteration part is performed after step 20 (estimating elongation) and before step 30 (optimizing elongation goals). The iteration part is a step 130 of selecting the next constraint in the table (i.e., first long pole path in the sorted list that has not yet been processed). All of the computations were completed prior to entering the main loop of the main algorithm.

User Interface

The description of the above algorithms assumes that the entire step is performed with no user interface. It is also possible, and for some embodiments, desirable to allow the user to override or influence the selection order. For example, some of the paths might be limiting factors for the speed of the entire design. If these paths could be shortened, the entire product might run faster, making its device more valuable. One way to allow users to influence the decision is to allow the user to pick which paths or constraints will be optimized first.

Another way is to allow the user to provide "weighting factors." For example, in the algorithm based on largest sum of expected elongations, if a particular constraint had a weighting factor of 1.2, the algorithm would multiply its actual sum of expected elongations by 1.2 before sorting it against other entries in the table. This would bias but not limit the algorithm toward optimizing this constraint first.

Details of the Process Steps—Optimizing Elongation Goals (Step 30 of FIG. 1)

As discussed above, once a particular goal has been selected in step 25 of FIG. 1, embodiments of the present invention attempt, in step 30 of FIG. 1, to optimize the constraint by reducing (or increasing) the length (or delay) of the path associated with the selected goal. There are many potential algorithms that can be used to optimize expected elongation, and a number of them will be discussed below. It is also possible to combine two or more optimization algorithms for additional power.

FIGS. 12 through 22 illustrate six implementations of FIG. 1's optimizing step that operates to improve expected elongation;

Rip-Up and Re-Order

Figure 12:
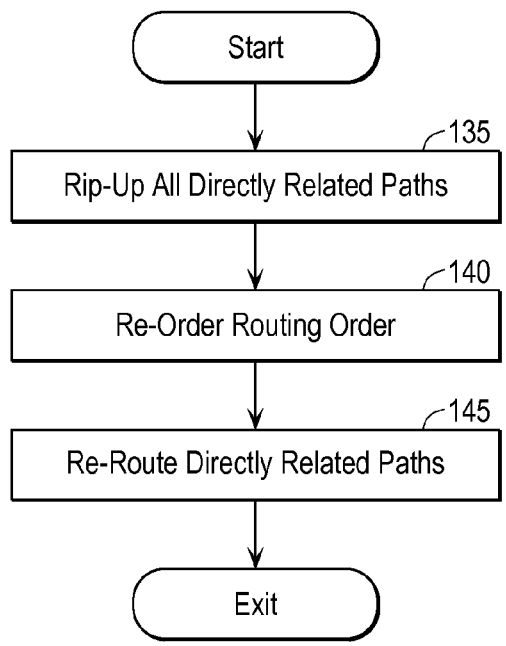
FIGS. 12 through 22 illustrate six implementations of FIG. 1's optimizing step that operates to improve expected elongation.

FIG. 12 is a flowchart of a first implementation of FIG. 1's optimizing step. This implementation operates to improve expected elongation by ripping up (un-routing) all of the paths affected by a particular constraint and then re-routing them in a different order. At a step 135, the system rips up, e.g., removes all the paths affected by the selected constraint or the selected long pole, preserving only the connection information. At a step 140, the system orders the paths by their expected elongation, sorting them by increasing expected elongation. Thus, the long pole (or long poles) with expected elongation of zero are first in the list. The last paths in the list will be short pole or short poles (if several paths have the same expected elongation). At a step 145, the system passes these paths to the SCR routing engine to be re-routed.

A comparison of FIGS. 2 and 5 shows how a shorter path for connection B could result from ripping up all three paths A, B, and C in the example of FIG. 2 and then routing path B first. Because the long pole connections that were causing the elongation are routed first, it is likely that they will find shorter paths. Because the short pole connections are routed last, it is likely that they will find longer paths.

In many cases, what had been the long poles will now cause less elongation to be needed. And, what had been short poles will now need less elongation. For example, consider the un-optimized routing solution in FIG. 2. FIG. 1's optimizing step 30 would have identified connection B as the long pole. If all three paths are ripped up and then connection B is routed first, the expected routing would be a shorter path for connection B, as can be seen in FIG. 5. If connections A and C are then routed after connection B, then routing is likely to appear as in the alternative solution of FIG. 5. Thus, the total expected elongation would be improved. This algorithm can be used with any autorouter, since it only affects the routing order not the internal cost formulas.

Temporary Cost Reduction

Figure 13:
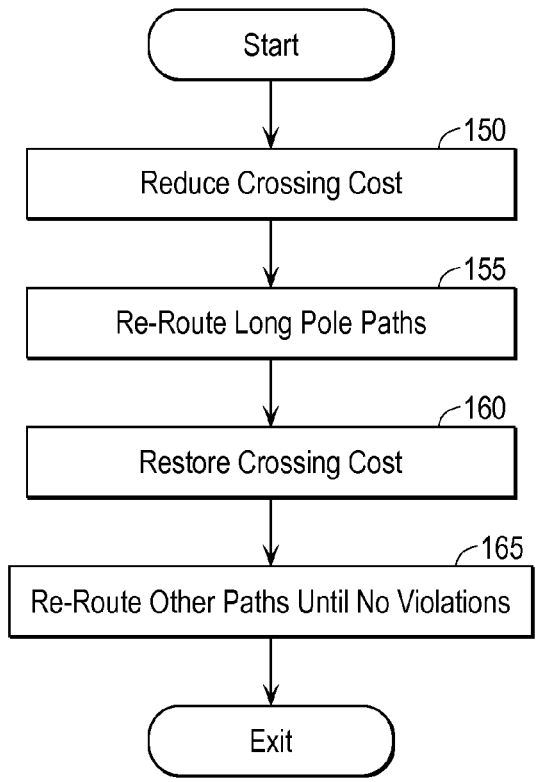

FIG. 13 is a flowchart of a second implementation of FIG. 1's optimizing step. This implementation operates by re-routing the long pole connection(s) using a reduced crossing cost and then attempting to eliminate any resulting crossings by re-routing the other connections. At a step 150, the system reduces the crossing cost. Rip-up routers normally have a parameter to their cost function that determines the cost of intentionally violating the routing area of another connection. This is sometimes called the "crossing cost." Reducing this cost will increase the likelihood that the SCR will select paths involving crossing violations. At a step 155, the long pole connection (or, in the case of several identical length connections, all of the long pole connections) are passed to the SCR to be re-routed using this reduced crossing cost.

At a step 160, the crossing cost is restored to its previous value. At a step 165, the other connections in the match group (or otherwise affected by the long pole) are then passed to the SCR. If all of the resulting violations can be eliminated by the SCR routing engine, then the total expected elongation should decrease because the long pole connection(s) had an opportunity to take shorter paths. For example, if step 155 of this algorithm is applied to connection B in the design in FIG. 2, the result is likely to create a crossing between connections B and C because the crossing cost has been reduced.

After running Steps 160 and 165, the result is likely to be that connection C gets re-routed to a path around the new path for signal B (see FIG. 5), since crossing B again is expensive. The result is that connection B got a shorter path and connection C got a longer path. Thus, the design required less elongation. This algorithm could be used with any rip-up router whether it is a topological router or a geometric router.

Inverse Proportional Crossing Cost

Figure 14:
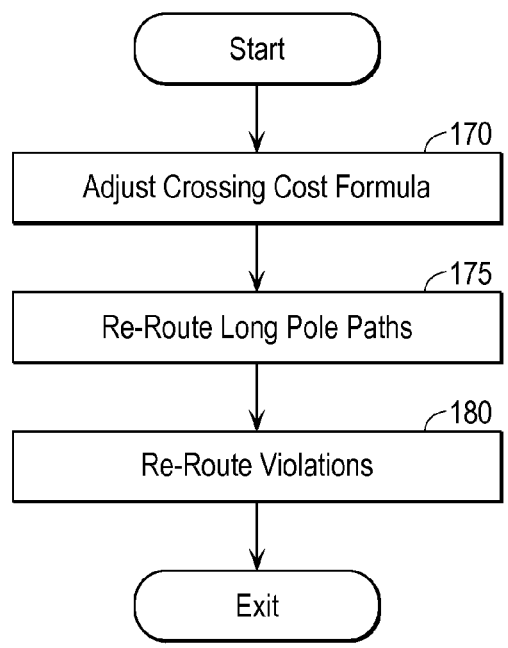

FIG. 14 is a flowchart of a third implementation of FIG. 1's optimizing step. This implementation operates by modifying the crossing cost such that it is inversely proportional to the expected elongation. At a step 170, the crossing cost formula for the SCR routing engine is modified such that the cost for a crossing is inversely proportional to the expected elongation of the path being crossed. Thus, a path with a large expected elongation would have a small crossing cost. At a step 175, the long pole connection(s) are rerouted using the new costing formula established in step 170. At a step 180, any paths with a violation are rerouted until there are no violations.

For example, applying step 175 to the design in FIG. 2 would cause connection B to be rerouted. The crossing cost against either connections A or C would low because these have a relatively larger expected elongation than connection B (which has an expected elongation of zero). Therefore, the path for connection B is likely to cross the path for connection C. During running of step 180, some or all of the connections will be re-routed. The path for connection B will continue to want to occupy the path of connection, since connection C will continue to have a low crossing cost. However, connection C will eventually find an alternative path because continuing to cross the path for connection B will have a high cost, since connection B has a low (zero) expected elongation. Eventually, the routing engine will produce the result similar to that shown in FIG. 4.

Bounding Box Meandering

Figure 15:
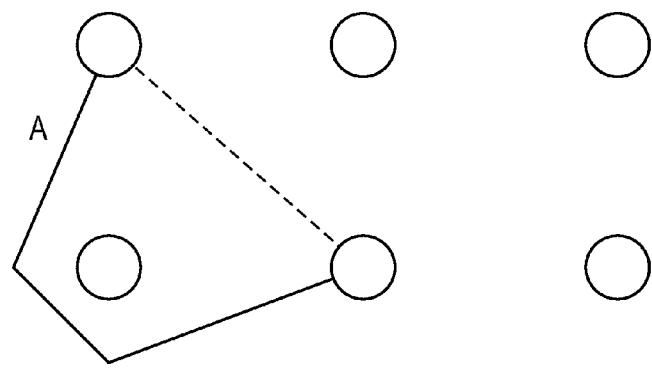
Figure 16:
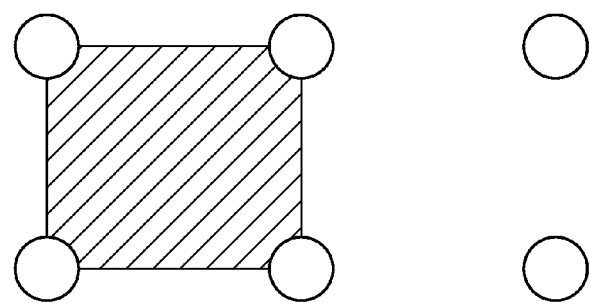

In some cases, it might not be possible to find a shorter path for the long pole, particularly when relative offsets have been used. In fact, a direct line connecting the source and target might still be long enough that it causes elongation on other signals. FIGS. 15 and 16 illustrate a fourth implementation of FIG. 1's optimizing step. This implementation operates by encouraging meandering through the use of a bounding box Although it might not be possible to reduce the amount of elongation, it might be possible to move the elongation to a less dense area of the design. There are several ways in which the costing formula for the SCR can be modified to encourage meandering. A signal path is said to meander if it takes a longer route than required. For example, in FIG. 15, the path selected for connection A is a meandering path because the direct route between its end pads is not blocked. One way to accomplish meandering is to increase the cost for traversing the bounding box rectangle formed by end pads. FIG. 16 shows a bounding box (depicted as a hatched rectangle) defining a region of increased cost for traversal. If the SCR increases the cost for traversing this rectangle, then the routing found in FIG. 15 is more likely to be selected by the SCR since going around the bounding box is less costly than going directly through it.

Waypoint Meandering

Figure 17:
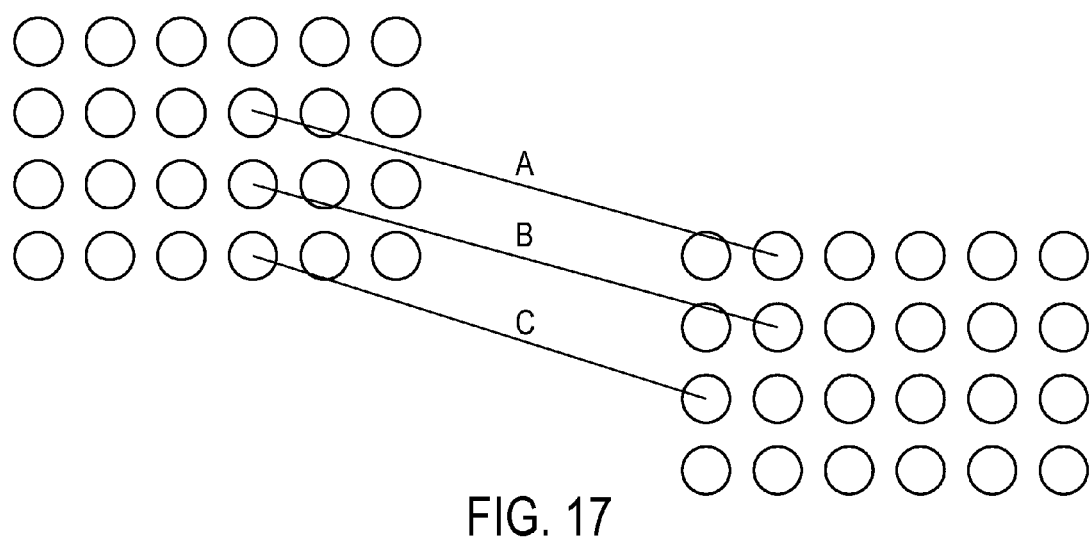
Figure 18:
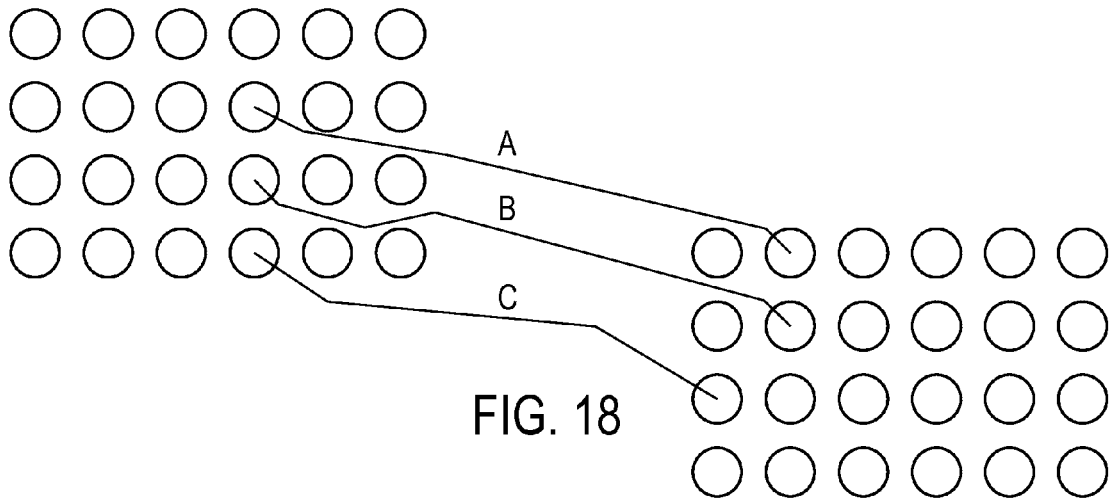

FIGS. 17, 18, 19, and 20 illustrate a fifth implementation of FIG. 1's optimizing step. This implementation operates by encouraging meandering through the use of waypoints. It is very common to have a match constraint on a set of connections going into a large array of pads. If there is an area near this array that does not have dense routing, the SCR path finding algorithm can be modified to require that the SCR expansion traverse one or more of these areas before proceeding to its destination pad. FIG. 17 shows an example of three connections between the two pin grid arrays (PGAs), and FIG. 18 shows a reasonable topological solution for routing these connections.

Suppose there is a minimum-delay constraint on these three connections. There is no long pole in this example. All three signal paths would need elongation. Finding shorter paths would be nearly impossible in this case. And, even if it were possible, it would only make the situation worse, requiring even more elongation. The only solution to this elongation problem is to add length. But, what happens if there are not enough real estate (routing area) between the PGAs to fit all of the elongation? In this case, the only possible solution would be to meander.

Figure 19:
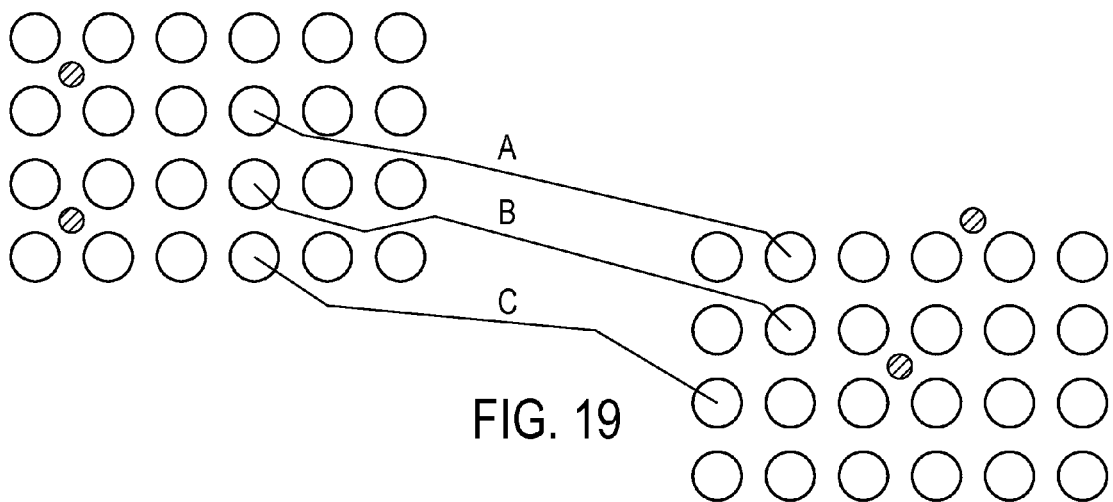
Figure 20:
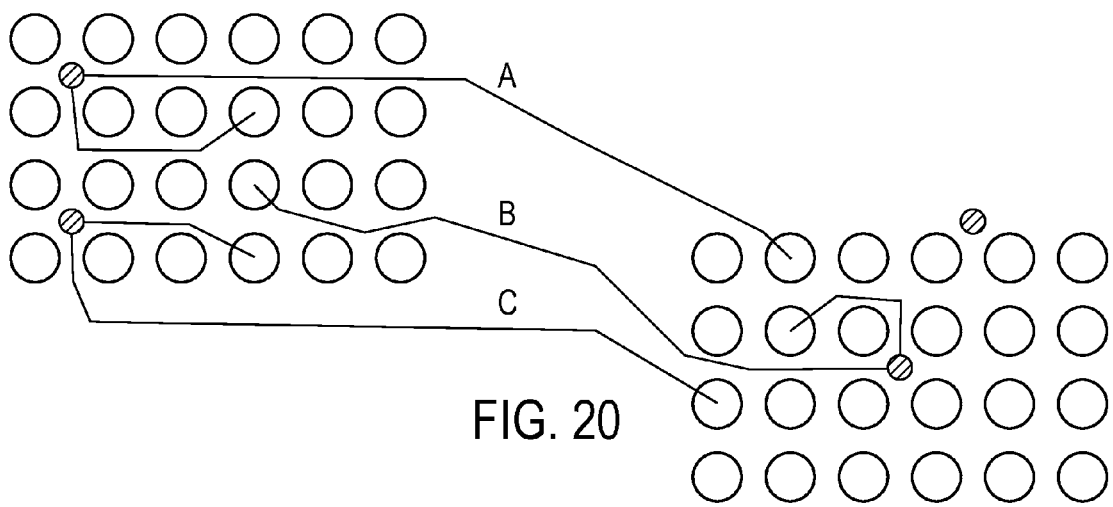

One way to force the SCR to pick a meander path is to insert waypoints and then require that the SCR find paths that pass through the waypoints. For example, FIG. 19 shows four waypoints (indicated by small hatched circles) having been added with the purpose of requiring the paths to pass through them. If the SCR is reconfigured to select only paths that pass through a waypoint, the resulting routing might look like that in FIG. 20, which shows elongated meandering paths passing through three of the waypoints. The routing solution shown in FIG. 20 will have longer signal paths and hence lower expected elongation. If this solution is passed to steps 40 (determine detailed routing solution) and 45 (elongate detailed paths), there will be less elongation needed; hence step 45 is more likely to be able to find enough real estate to add the required elongation.

Jump Meandering

Figure 21:
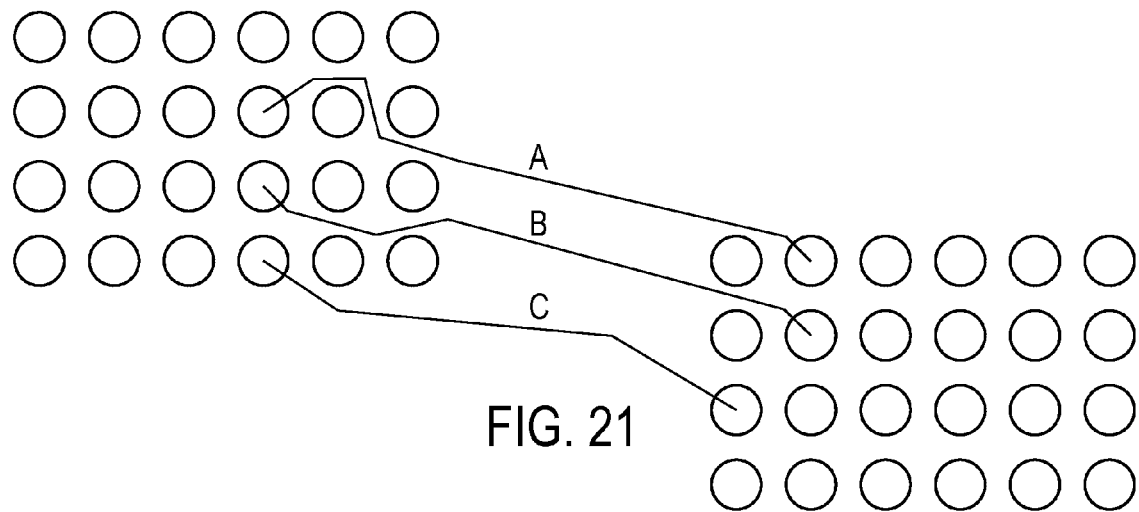
Figure 22:
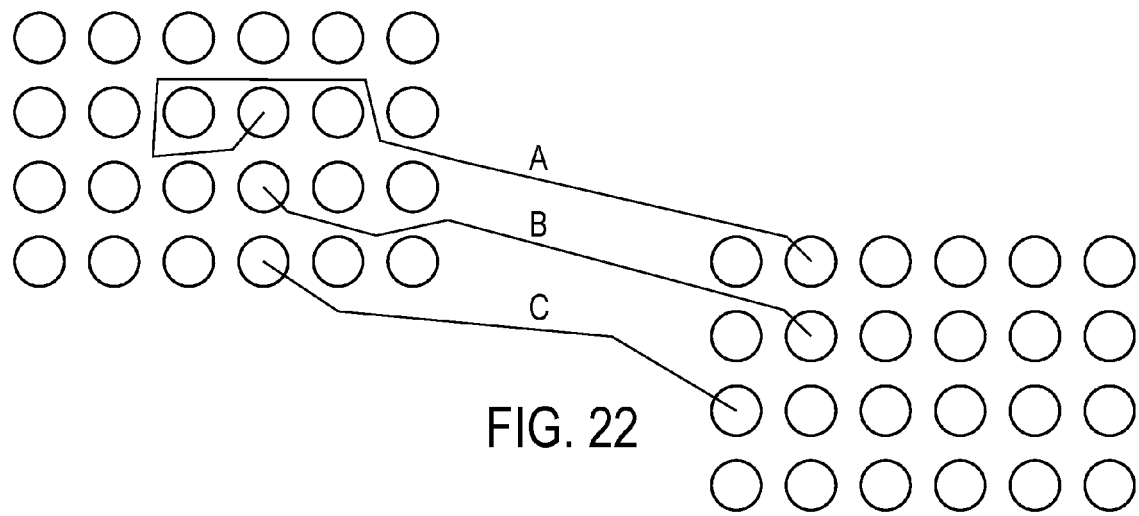

Yet another way to add meandering is to perform a series of topological transformations to gradually move the outer and then the inner signal paths to longer paths. FIGS. 21 and 22 illustrate a sixth implementation of FIG. 1's optimizing step. This implementation operates by encouraging meandering through the use of topological jump operations. In many cases, this jump meandering can be performed by the same algorithms used to remove overloads in a partial topological solution. Additional information on topological transformations can be found in U.S. Pat. No. 7,464,358 to Wadland et al. for "Method for Resolving Overloads in Autorouting Physical Interconnections," which is incorporated by reference.

For example, FIG. 21 shows a possible topological solution resulting from a first topological jump operation being performed on the path for connection A in the initial topological solution of FIG. 18. FIG. 22 shows a possible topological solution resulting from a second topological jump operation being performed on the topological solution of FIG. 21. After several more jumps, the results might look like that shown in FIG. 20 (which was established using waypoint meandering).

Two or more of the meandering algorithms discussed in connection with FIGS. 15 through 22 could be combined to produce a robust meandering solution. Combining them with one of more of the algorithms discussed in connection with FIGS. 12 through 14 would yield a still more optimization step 30.

Hardware Overview

Figure 23:
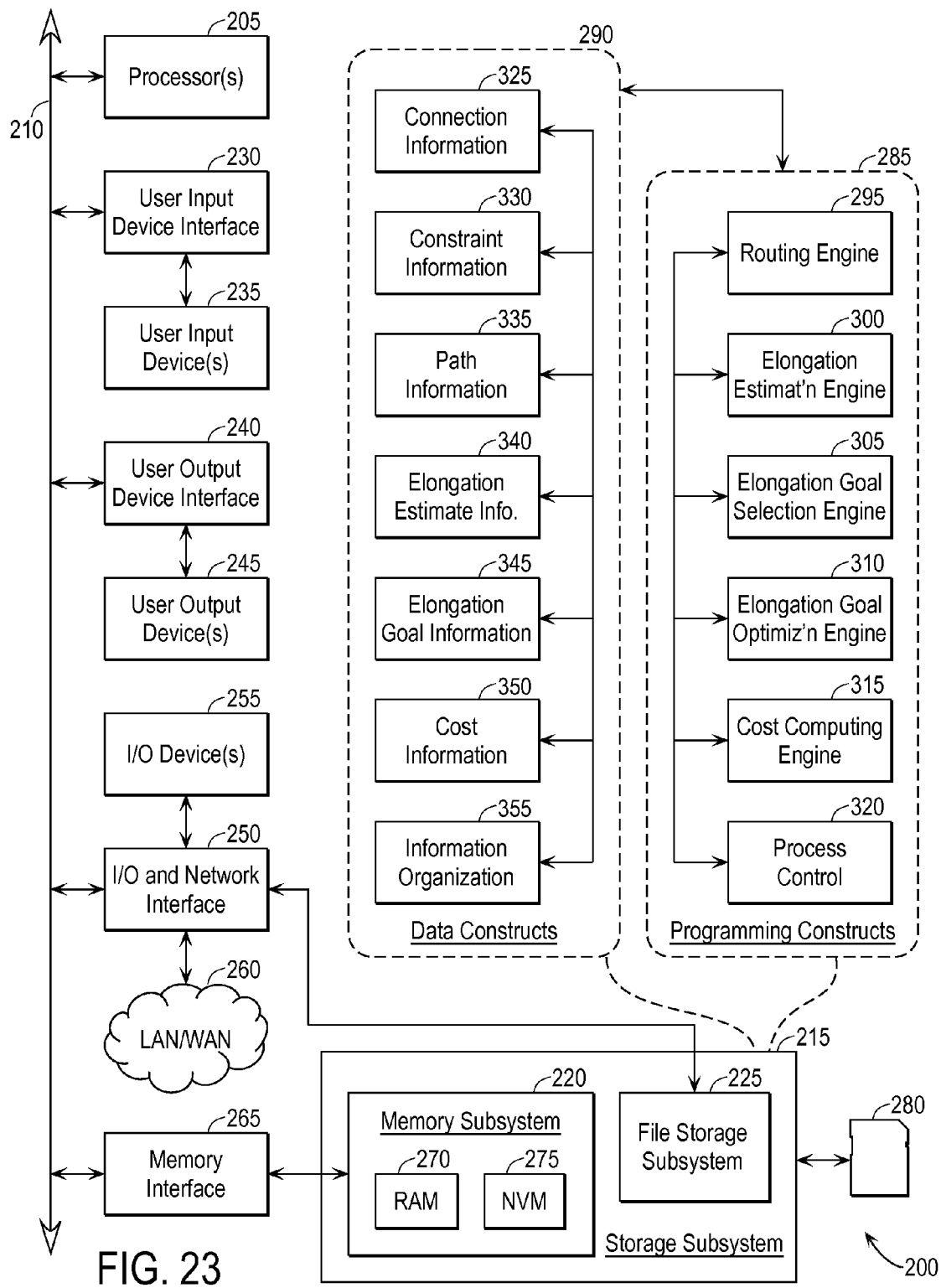
FIG. 23 is a hardware/software block diagram of a representative system that can be used for embodiments of the present invention.

FIG. 23 is a hardware/software block diagram of a representative system 200 that can be used to implement embodiments of the present invention. For concreteness, a representative general purpose computer system for performing operations as discussed above is shown. However, systems for implementing embodiments of the present invention do not need to contain all the components shown, and further they may contain additional components. Although the specifically described embodiments are processor-based embodiments, other embodiments can be implemented with certain portions implemented using special purpose hardware.

System 200 is preferably processor-based, and to that end typically includes one or more processors 205, which can be conventional microprocessors. References to "a processor" or "the processor" should be considered to include multiple processors and/or multiple processor cores in a single processor chip. The processor(s) can communicate with a number of peripheral devices via a bus subsystem 210. Bus subsystem 210 provides a mechanism for letting the various components and subsystems of system 200 communicate with each other as intended. In addition to processor(s) 205, system 200 includes a storage subsystem 215, which is shown as having a memory subsystem 220 and a file storage subsystem 225.

Other devices on the bus can include various interface controllers for connecting to other devices or functional elements that may or may not connect via the bus. In the representative configuration shown in FIG. 23, the additional devices include a user input device interface 230 (shown coupled to one or more user input devices 235), a user output device interface 240 (shown coupled to one or more user output devices 245), an I/O and network interface 250 (shown coupled to one or more I/O devices 255, to one or more networks 260, and to file storage subsystem 225), and a memory interface 265 (shown as coupled to memory subsystem 220). The user input device interface and user output device interface are shown with bi-directional connections to their respective user input and output devices. This represents the fact that an input device may receive control and status signals from its interface, and an output device provide control and status signals to its interface Processor(s) 205 and Bus Subsystem 210

Embodiments of the invention can be implemented with many different types of processor. The operations can be performed on general purpose computers as well as dedicated CAD workstations, supercomputers, and the like. In specific embodiments, general purpose computers using processors made by Intel Corporation (Santa Clara, Calif.) or Advanced Micro Devices, Inc. ("AMD," Sunnyvale, Calif.) can be used. The computers can operate under a variety of operating systems, including various versions of MacOS (Apple Inc. Cupertino, Calif.), UNIX, Linux, Solaris (Sun Microsystems, Inc., Santa Clara, Calif.), and Windows (Microsoft Corporation, Redmond Wash.), to name a few.

Although bus subsystem 210 is shown schematically as a single bus, embodiments of the bus subsystem may utilize multiple buses, and various of the components may have private connections. Further, the components do not have to be at the same physical location, but rather may be distributed at various locations on a local area network (LAN) or even more remotely. With evolution in bus and I/O technology, the distinctions can become blurred. Although buses originally contemplated shared parallel buses (either with separate data and address lines, or multiplexed data and address lines), representative bus interconnect schemes also can include serial buses such as PCI Express (PCIe) and USB.

Storage Subsystem 215

Storage subsystem 215 can include various types of storage media, and stores the basic programming and data constructs that provide at least some of the functionality of system 200. As mentioned above, storage subsystem 215 includes memory subsystem 220 and file storage subsystem 225. With constant evolution in computer storage technology, the distinctions can become blurred.

Memory subsystem 220 typically includes a number of memories including a main random access memory (RAM) 270 for storage of instructions and data during program execution and a non-volatile memory (NVM) 275 in which fixed instructions and parameters are stored. The main memory is typically hierarchical in nature with one or more levels of cache implemented as static random access memory (SRAM) and main memory implemented as dynamic random access memory (DRAM). While the non-volatile memory may be a ROM, rewritable non-volatile memories such as flash EPROMs may be used.

File storage subsystem 225 provides persistent (non-volatile) storage for program and data files, and may include one or more hard disk drives and/or flash memory drives. Additionally the file storage subsystem may support one or more drives for reading and writing removable media. An instance of a removable computer-readable medium is shown symbolically as a removable flash memory card 280 such as the type used in digital cameras and mobile phones. Possible types of flash memory cards include but are not limited to Secure Digital (SD), CompactFlash (CF), Memory Stick (MS), MultiMediaCard (MMC) xD-Picture Card (xD), and SmartMedia (SM).

Removable media can also include, for example, removable magnetic media (e.g., magnetic tape, floppy disks, or larger capacity flexible or rigid media such as those marketed under the ZIP and JAZ registered trademarks by Iomega Corporation), and optical media (e.g., CD-ROM, CD-R, CD-RW, DVD-ROM, DVD-RAM, DVD-R, DVD-RW). One or more of the drives may be located at remote locations on other connected computers on one or more of networks 260, and may be shared by multiple computers.

I/O and Network Interface 250

I/O and network interface 250 may include one or more peripheral interfaces such as PCIe, USB, IEEE 1394 (Firewire), SATA, e-SATA, and Bluetooth (a short-range wireless communication standard developed by the Bluetooth SIG and licensed under the trademark Bluetooth®). The I/O and network interface may also or alternatively include one or more wired networking interfaces (e.g., Ethernet) or wireless networking interfaces (e.g., Wi-Fi adhering to one of the 802.11 family standards, or digital mobile phone technologies). Thus, depending on the embodiment, I/O and network interface 250 can provide an interface to one or more host computers, or one or more networks. The I/O and network subsystem need not be configured for all these possibilities; it can be very limited in scope for some embodiments.

In addition to the Ethernet and wireless networking protocols, I/O and network interface 250 may include, for example, a modem, an Integrated Digital Services Network (ISDN) device, an Asynchronous Transfer Mode (ATM) device, a Direct Subscriber Line (DSL) device, a fiber optic device, or a cable TV device.

User Input Devices 235 and Output Devices 245

The input and output devices allow user interaction with system 200. In general, use of the term "input device" is intended to include all possible types of devices and ways to input information into the system. The user input devices coupled to user input device interface 230 may include one or more of the following: keyboards; pointing devices such as mice, trackballs, touchpads, or graphics tablets; scanners, barcode scanners; touchscreens incorporated into displays; audio input devices such as voice recognition systems, microphones, and other types of input devices. User input device interface 230 incorporates the technology required to support the user input devices, or vice versa. USB is a common interface technology for keyboards, pointing devices touchpads, graphics tablets, and scanners. Serial port and PS/2 controllers are also deployed in some systems.

Similarly, the term "output device" is intended to include all possible types of devices and ways to output information from the system to a user or to another machine or computer system. While common user output devices coupled to user output device interface 240 include displays and printers, systems can also provide non-visual output such as audio. Suitable display technologies can include cathode ray tube ("CRT") displays, liquid crystal displays ("LCDs"), or light emitting diode ("LED") displays. Similarly, user output device interface 240 incorporates the technology required to support the user output devices, or vice versa. Display technologies include VGA, DVI, HDMI, and DisplayPort to name a few. USB is common for printers and audio output devices, although the interface can provide analog audio out signals if necessary.

Details of Contents of Storage Subsystem 215

FIG. 23 shows, in addition to the hardware components, detailed views of the types of information stored in storage subsystem 215. This is broken out into two blocks, referred to as programming constructs 285 and data constructs 290. These will now be described in further detail, and tied to the methods described above in connection with embodiments of the present invention. While the programming and data constructs are shown separately, this is for convenience only, and is not intended to negate implementations using object-oriented programming where data and methods are encapsulated.

The programming constructs include a routing engine 295, an elongation estimation engine 300, an elongation goal selection engine 305, an elongation goal optimization engine 310, and a cost computing engine 315. These engines are shown in communication with each other and with a process control block 320. This representation is only suggestive, since the engines do not necessarily communicate with each other. Some or all may only communicate with process control block 320, and others may only communicate with each other.

Routing engine 295 implements the routing operations discussed above, for example, in connection with step 15 of determining an initial routing solution and possibly step 40 of determining a detailed routing solution. Elongation estimation engine 300 implements, for example, step 20 of estimating elongation of the initially routed paths. Elongation goal selection engine 305 implements, for example, step 25 of selecting elongation goals. Elongation goal optimization engine 310 implements, for example, step 30 of optimizing elongation goals. The above-mentioned steps are described in detail above, some with multiple implementations.

Process control block 320 controls the way that the engines inter-operate, for example the way one engine operates on data processed by another. Although the flowchart in FIG. 1 shows the steps being performed in sequence, embodiments of the present invention can benefit from concurrent processing. For example, while elongation estimation requires initial routing information, it is possible for elongation estimation engine 300 to be processing previously generated initial routing information while routing engine 295 is processing new connection information.

The data constructs include connection information 325, constraint information 330, path information 335, elongation estimate information 340, elongation goal information 345, and cost information 350. The way any of the types of information is organized depends on the type of information and the implementation. For example, the connection information can be stored as one or more netlists, which have particular preferred data formats. In some embodiments, one or more of these data constructs can be organized according to desired database models. Some of the data constructs (e.g., connection information 325 and constraint information 330) are provided as inputs to be operated on by one or more of the engines, while others are generated by one or more of the engines, possibly to be operated on by one or more different engines.

The path information for a given connection can be generated initially by routing engine 295 and one or more subsequent modifications by the routing engine can be specified by one or more other engines (e.g., elongation goal optimization engine 310). While the path information can include information specifying the path, it can also include information about the path that is used by other engines (e.g., whether the path is a long pole). Furthermore, some of the data constructs can be tied to others by a predetermined relationship. For example, the initial path information for a given connection is later associated with estimated elongation information.

The data constructs are shown as further including an information organization block 355. This is intended to represent such constructs as database schemas representing the manner in which various ones of the data constructs relate to each other.

CONCLUSION

In conclusion, it can be seen that embodiments of the present invention can provide efficient techniques for routing connections that are required to satisfy elongation constraints.

While the above is a complete description of specific embodiments of the invention, the above description should not be taken as limiting the scope of the invention as defined by the claims.

What is claimed is:

1. A routing method for a computer system having one or more computer processors and a non-transitory computer-readable storage medium storing a computer readable program for performing the method, the method comprising:
    for a set of connections subject to constraints including a set of elongation constraints, generating, with one or more of the computer processors, an initial set of topological paths without considering at least some of the elongation constraints, wherein the elongation constraints include at least one constraint that can be addressed by changing a length or delay of a path of one or more connections subject to the constraint;
    estimating, with one or more of the computer processors, an initial set of elongations that would, when applied to at least some paths in the initial set, cause the initial set of paths to meet the elongation constraints, the initial set of elongations including increased length or delay in one or more paths in the initial set of paths, wherein an elongation refers to changing a length or delay of a path of one or more connections that are subject to the constraint;
    generating, with one or more of the computer processors, a new set of topological paths by re-routing at least some paths in the initial set to reduce an overall estimated increased length or delay for the initial set of paths;
    estimating, with one or more of the computer processors, a new set of elongations that would, when applied to at least some paths based on the new set of paths, cause the paths based on the new set of paths to meet the elongation constraints;
    generating, with one or more of the computer processors, an elongated set of paths by applying, with one or more of the computer processors, the new set of elongations to the paths based on the new set of paths;
    storing path information based on the elongated set of paths in the computer-readable storage medium; and
    after generating the new set of paths and prior to estimating the new set of elongations, determining geometric paths based on the new set of paths.

2. The method of claim 1 wherein:
    the geometric paths are used for estimating the new set of elongations.

3. The method of claim 1 wherein:
    the initial set of paths are geometric paths; and
    the new set of paths are geometric paths.

4. The method according to claim 1, wherein the method further comprising using a routing apparatus to execute the method of claim 1, the routing apparatus comprising:
    a non-transitory storage medium containing program instructions; and
    a processor coupled to said storage medium for executing program instructions stored in said storage medium;
    wherein said program instructions are configured so that when said processor executes said program instructions, the routing apparatus executes the method of claim 1.

5. A printed circuit board having conductive traces laid out according to a design produced by performing the method of claim 1.

6. An integrated circuit package having conductive traces laid out according to a design produced by performing the method of claim 1.

7. A routing method comprising:
    for a set of connections subject to constraints including a set of elongation constraints, determining, by using a computer, an initial set of paths without considering at least some of the elongation constraints, wherein the elongation constraints include at least one constraint that can be addressed by changing a length or delay of a path of one or more connections subject to the constraint;
    estimating, by computing using the computer, elongations that would, when applied to at least some paths in the initial set, cause the initial set of paths to meet the elongation constraints, the estimated elongations including increased length or delay of one or more paths in the initial set of paths;
    using the estimated elongations to select connections for further processing;
    using information regarding at least some of the selected connections to generate a new set of paths that includes new paths replacing at least some paths in the initial set of paths, wherein the new set of paths requires less elongation to meet the elongation constraints than the elongation required by the initial set of paths;
    elongating, by using the computer, at least some of the paths in the new set of paths; and
    after generating the new set of paths and prior to estimating the new set of elongations, determining geometric paths based on the new set of paths.

8. The method according to claim 7, wherein the method further comprising using a routing apparatus to execute the method of claim 7, the routing apparatus comprising:
    a non-transitory storage medium containing program instructions; and
    a processor coupled to said storage medium for executing program instructions stored in said storage medium;
    wherein said program instructions are configured so that when said processor executes said program instructions, the routing apparatus executes the method of claim 7.

9. A non-transitory computer-readable medium containing program instructions that when executed by a computer system cause the computer system to execute the routing method of claim 7.

10. A printed circuit board having conductive traces laid out according to a design produced by performing the method of claim 7.

11. An integrated circuit package having conductive traces laid out according to a design produced by performing the method of claim 7.

12. A routing method comprising:
for a set of connections subject to constraints including a set of elongation constraints, generating, by using a computer, an initial set of topological paths without considering at least some of the elongation constraints, wherein the elongation constraints include at least one constraint that can be addressed by changing a length or delay of a path of one or more connections subject to the constraint;
estimating, by using the computer, an elongation for each of the initial set of paths that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;
selecting a set of elongation goals, at least in part based on the estimated elongations;
optimizing the elongation goals by generating a new set of topological paths that includes new paths replacing at least some paths in the initial set of paths, wherein generating the new set of paths including re-routing the initial set of paths in an order determined at least in part based on the estimated elongations;
determining and applying elongation, by using the computer, to at least some of the paths in the new set of paths to cause the new set of paths to meet the elongation constraints; and
after generating the new set of paths and prior to estimating the new set of elongations, determining geometric paths based on the new set of paths.

13. The method of claim 12 wherein:
the set of constraints includes one or more non-elongation constraints exclusive of the set of elongation constraints;
the initial set of paths satisfies at least one of the non-elongation constraints.

14. The method of claim 12 wherein:
the initial set of paths are topological paths; and
the method further comprises, after determining new paths, determining geometric paths prior to performing elongation.

15. The method of claim 12 wherein the initial paths are geometric paths.

16. The method of claim 12 wherein at least one of the elongation goals is that the associated connection be shortened.

17. The method of claim 12 wherein at least one of the elongation goals is that the associated connection be lengthened.

18. The method of claim 12 wherein selecting a set of elongation goals includes finding the next connection causing the largest expected elongation.

19. The method of claim 12 wherein selecting a set of elongation goals includes finding the next connection causing the largest total expected elongation.

20. The method of claim 12 wherein selecting a set of elongation goals includes finding the next constraint causing the largest sum of expected elongation.

21. The method of claim 12 wherein generating the new set of paths comprises:
un-routing the paths for a set of connections associated with a given elongation constraint; and
determining paths for the set of connections in a different order than an order that was used in determining the initial set of paths.

22. The method of claim 12 wherein generating the new set of paths comprises:
un-routing the paths for a set of connections associated with a given elongation constraint;
determining a path for a given connection in the set with a reduced cost associated with that connection's path crossing another connection's path; and
determining new paths crossed by the given connection's paths to eliminate the crossing.

23. The method of claim 12 wherein generating the new set of paths comprises:
un-routing the paths for a set of connections associated with a given elongation constraint;
determining a new path for a given connection in the set with a cost associated with that connection's path crossing another connection's path wherein the cost varies inversely with the expected elongation of the path being crossed; and
determining new paths crossed by the given connection's path to eliminate the crossing.

24. The method of claim 12 wherein generating the new set of paths comprises:
establishing a region of increased cost interposed in a direct path; and
generating a path in the new set of paths using a routing algorithm that causes the path in the new set to meander around the region of increased cost.

25. The method of claim 12 wherein generating the new set of paths comprises:
establishing a set of waypoints displaced from a direct path; and
generating a path in the new set of paths using a routing algorithm that causes the path in the new set to meander so that it passes through at least one of the set of waypoints.

26. The method of claim 12 wherein generating the new set of paths comprises using a router that subjects an existing path to a topological jump operation.

27. The method according to claim 12, wherein the method further comprising using a routing apparatus to execute the method of claim 12, the routing apparatus comprising:
a non-transitory storage medium containing program instructions; and
a processor coupled to said storage medium for executing program instructions stored in said storage medium;
wherein said program instructions are configured so that when said processor executes said program instructions, the routing apparatus executes the method of claim 12.

28. A non-transitory computer-readable medium containing program instructions that when executed by a computer system cause the computer system to execute the routing method of claim 12.

29. A printed circuit board having conductive traces laid out according to a design produced by performing the method of claim 12.

30. An integrated circuit package having conductive traces laid out according to a design produced by performing the method of claim 12.

31. Routing apparatus comprising:
a non-transitory storage medium containing program instructions; and
a processor coupled to said storage medium for executing program instructions stored in said storage medium;

wherein said program instructions are configured so that when said processor executes said program instructions, the routing apparatus is configured to:

for a set of connections subject to constraints including a set of elongation constraints, generate an initial set of topological paths without considering at least some of the elongation constraints, wherein the elongation constraints include at least one constraint that can be addressed by changing a length or delay of a path of one or more connections subject to the constraint;

estimate an initial set of elongations that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;

generate a new set of topological paths by re-routing, with one or more of the computer processors, at least some paths in the initial set to reduce an overall estimated elongation for the initial set of paths;

estimate a new set of elongations that would, when applied to at least some paths based on the new set of paths, cause the paths based on the new set of paths to meet the elongation constraints;

generate an elongated set of paths by applying, with one or more of the computer processors, the new set of elongations to the paths based on the new set of paths; and after generating the new set of paths and prior to estimating the new set of elongations, determining geometric paths based on the new set of paths.

32. Apparatus for routing a set of connections subject to constraints including a set of elongation constraints, the apparatus comprising:

means for generating an initial set of topological paths without considering at least some of the elongation constraints, wherein the elongation constraints include at least one constraint that can be addressed by changing a length or delay of a path of one or more connections subject to the constraint;

means, responsive to the initial set of paths, for estimating elongations that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;

means for generating a new set of topological paths including means for re-routing at least some paths in the initial set to reduce an overall estimated elongation for the initial set of paths; and means for estimating a new set of elongations that would, when applied to at least some paths based on the new set of paths, cause the paths based on the new set of paths to meet the elongation constraints;

means for generating an elongated set of paths by applying the new set of elongations to the paths based on the new set of paths; and after generating the new set of paths and prior to estimating the new set of elongations, means for determining geometric paths based on the new set of paths.

33. The apparatus of claim 32 wherein:
the initial set of paths are topological paths;
the new set of paths are topological paths; and
the apparatus further comprises, means for determining geometric paths based on the new set of paths, said means for determining geometric paths operating prior to said means for estimating the new set of elongations.

34. The apparatus of claim 32 wherein:
the initial set of paths are geometric paths; and
the new set of paths are geometric paths.

35. Apparatus for routing a set of connections subject to constraints including a set of elongation constraints, the apparatus comprising:

means for determining an initial set of topological paths without considering at least some of the elongation constraints, wherein the elongation constraints include at least one constraint that can be addressed by changing a length or delay of a path of one or more connections subject to the constraint;

means, responsive to the initial set of paths, for estimating elongations that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;

means, responsive to the estimated elongations, for selecting connections for further processing;

means, responsive to information regarding at least some of the selected connections, for generating a new set of topological paths that includes new paths replacing at least some paths in the initial set of paths, wherein the new set of paths requires less elongation to meet the elongation constraints than the elongation required by the initial set of paths;

means for elongating at least some of the paths in the new set of paths; and after generating the new set of paths and prior to estimating the new set of elongations, means for determining geometric paths based on the new set of paths.

36. Apparatus for routing a set of connections subject to constraints including a set of elongation constraints, the apparatus comprising:

means for generating an initial set of topological paths without considering at least some of the elongation constraints, wherein the elongation constraints include at least one constraint that can be addressed by changing a length or delay of a path of one or more connections subject to the constraint;

means, responsive to the initial set of paths, for estimating elongations that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;

selecting a set of elongation goals, at least in part based on the estimated elongations;

means for optimizing the elongation goals by generating a new set of topological paths that includes new paths replacing at least some paths in the initial set of paths;

means, responsive to information regarding at least some of the new paths, for determining and applying elongation to at least some of the paths in the new set of paths to cause the new set of paths to meet the elongation constraints; and after generating the new set of paths and prior to estimating the new set of elongations, means for determining geometric paths based on the new set of paths.

37. A non-transitory computer-readable medium containing program instructions, which when executed by a computer system cause the computer system to execute a routing method, the program instructions including:

code that when executed causes the computer system to generate, for a set of connections subject to constraints including a set of elongation constraints, an initial set of topological paths without considering at least some of the elongation constraints, wherein the elongation constraints include at least one constraint that can be addressed by changing a length or delay of a path of one or more connections subject to the constraint;

code that when executed causes the computer system to estimate an initial set of elongations that would, when applied to at least some paths in the initial set, cause the initial set of paths to meet the elongation constraints, the estimated elongations including increased length or delay for one or more paths in the initial set of paths, wherein an elongation refers to changing a length or delay of a path of one or more connections that are subject to the constraint;

code that when executed causes the computer system to generate a new set of topological paths by re routing, with one or more of the computer processors, at least some paths in the initial set to reduce an overall estimated elongation for the initial set of paths;

code that when executed causes the computer system to estimate a new set of elongations that would, when applied to at least some paths based on the new set of paths, cause the paths based on the new set of paths to meet the elongation constraints;

code that when executed causes the computer system to generate an elongated set of paths by applying, with one or more of the computer processors, the new set of elongations to the paths based on the new set of paths; and after generating the new set of paths and prior to estimating the new set of elongations, that when executed causes the computer system to determine geometric paths based on the new set of paths.

* * * * *